United States Patent
Ko et al.

(10) Patent No.: US 10,283,709 B2
(45) Date of Patent: May 7, 2019

(54) SEMICONDUCTOR DEVICE AND METHOD OF MANUFACTURING THE SAME

(71) Applicant: SK hynix Inc., Icheon (KR)

(72) Inventors: Young Seok Ko, Suwon (KR); Soo Gil Kim, Seongnam (KR); Joo Young Moon, Yongin (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/824,999

(22) Filed: Nov. 28, 2017

(65) Prior Publication Data

US 2018/0315922 A1    Nov. 1, 2018

(30) Foreign Application Priority Data

Apr. 26, 2017    (KR) ........................ 10-2017-0053927

(51) Int. Cl.
  *H01L 27/24*    (2006.01)
  *H01L 45/00*    (2006.01)

(52) U.S. Cl.
  CPC ...... *H01L 45/1608* (2013.01); *H01L 27/2463* (2013.01); *H01L 45/1233* (2013.01); *H01L 45/1641* (2013.01)

(58) Field of Classification Search
  None
  See application file for complete search history.

(56) References Cited

U.S. PATENT DOCUMENTS

| | | | | |
|---|---|---|---|---|
| 5,946,230 A | * | 8/1999 | Shimizu ................ | H01L 27/105 257/314 |
| 6,806,524 B2 | * | 10/2004 | Ooishi ................... | B82Y 10/00 257/295 |
| 6,928,015 B2 | * | 8/2005 | Ooishi ................... | B82Y 10/00 257/E21.665 |
| 7,022,531 B2 | * | 4/2006 | Ozaki ............... | H01L 27/11502 257/E21.664 |
| 7,863,668 B2 | * | 1/2011 | Takahashi ............. | H01L 27/115 257/314 |
| 8,242,583 B2 | | 8/2012 | Yune et al. | |

(Continued)

FOREIGN PATENT DOCUMENTS

KR    10-0791697 B1    1/2008

*Primary Examiner* — David E Graybill

(57) ABSTRACT

In an embodiment, a substrate that includes a cell region and a dummy region is provided. Lower interconnection structures are formed in the cell region and the dummy region. One or more first multilayered structure patterns are formed in the cell region and one or more second multilayered structure patterns in the dummy region over the lower interconnection structures. The first multilayered structure patterns and second multilayered structure patterns extend in a first direction. Each of the second multilayered structure patterns includes an etch target layer. An insulating material layer is formed over the first multilayered structure patterns and the second multilayered structure patterns. An interlayer insulating layer that fills a space between two adjacent patterns of the first multilayered structure patterns and second multilayered structure patterns is formed by planarizing the insulating material layer. The etch target layer in each of the second multilayered structure patterns is removed.

16 Claims, 36 Drawing Sheets

(56) References Cited

U.S. PATENT DOCUMENTS

| | | | | |
|---|---|---|---|---|
| 8,466,506 B2* | 6/2013 | Takekida | H01L 27/11521 | 257/315 |
| 8,546,196 B2* | 10/2013 | Kuniya | H01L 27/1021 | 257/E21.582 |
| 8,649,202 B2* | 2/2014 | Sakaguchi | G11C 13/0004 | 365/148 |
| 8,649,217 B2* | 2/2014 | Kuniya | H01L 27/2481 | 365/185.05 |
| 8,686,392 B2* | 4/2014 | Tsukamoto | G11C 11/16 | 257/5 |
| 8,753,973 B2* | 6/2014 | Furuhashi | H01L 45/04 | 438/393 |
| 8,785,314 B2* | 7/2014 | Pellizzer | H01L 45/06 | 438/104 |
| 8,785,980 B2* | 7/2014 | Osaki | H01L 23/49838 | 257/211 |
| 9,142,512 B2* | 9/2015 | Osaki | H01L 23/49838 | |
| 9,246,100 B2* | 1/2016 | Ravasio | H01L 45/1666 | |
| 9,252,097 B2* | 2/2016 | Baba | H01L 23/49844 | |
| 9,263,674 B2* | 2/2016 | Pellizzer | H01L 45/06 | |
| 9,293,508 B2* | 3/2016 | Sasago | H01L 27/2409 | |
| 9,368,553 B2* | 6/2016 | Asao | H01L 27/2463 | |
| 9,379,013 B1* | 6/2016 | Tsukamoto | H01L 21/76897 | |
| 9,583,538 B2* | 2/2017 | Noda | H01L 27/2481 | |
| 9,627,440 B2* | 4/2017 | Russo | H01L 27/2445 | |
| 9,711,567 B2* | 7/2017 | Grenouillet | H01L 45/08 | |
| 9,773,844 B2* | 9/2017 | Ravasio | H01L 45/1666 | |
| 9,954,168 B2* | 4/2018 | Noda | H01L 27/2481 | |
| 10,128,315 B2* | 11/2018 | Russo | H01L 27/2445 | |
| 10,147,878 B2* | 12/2018 | Noda | H01L 27/2481 | |
| 2009/0230450 A1* | 9/2009 | Shiino | H01L 27/11578 | 257/314 |
| 2010/0109071 A1* | 5/2010 | Tanaka | H01L 27/11578 | 257/324 |
| 2011/0069531 A1* | 3/2011 | Aburada | G11C 5/02 | 365/148 |
| 2011/0227019 A1* | 9/2011 | Kuniya | H01L 27/1021 | 257/2 |
| 2011/0286261 A1* | 11/2011 | Sakaguchi | G11C 13/0004 | 365/148 |
| 2012/0032242 A1* | 2/2012 | Aoki | H01L 27/10814 | 257/296 |
| 2012/0051122 A1* | 3/2012 | Tsuji | H01L 27/228 | 365/158 |
| 2012/0193601 A1* | 8/2012 | Tsukamoto | G11C 11/16 | 257/5 |
| 2013/0064001 A1* | 3/2013 | Terai | H01L 45/04 | 365/148 |
| 2013/0069029 A1* | 3/2013 | Kuniya | H01L 27/2409 | 257/2 |
| 2013/0237028 A1* | 9/2013 | Furuhashi | H01L 45/04 | 438/382 |
| 2013/0249113 A1* | 9/2013 | Baba | H01L 23/49844 | 257/776 |
| 2013/0249114 A1* | 9/2013 | Osaki | H01L 23/49838 | 257/776 |
| 2013/0292633 A1* | 11/2013 | Pellizzer | H01L 45/06 | 257/5 |
| 2014/0239246 A1* | 8/2014 | Noda | H01L 27/2481 | 257/4 |
| 2014/0246646 A1* | 9/2014 | Sasago | H01L 27/2409 | 257/5 |
| 2014/0312509 A1* | 10/2014 | Osaki | H01L 23/49838 | 257/776 |
| 2014/0339493 A1* | 11/2014 | Pellizzer | H01L 45/06 | 257/4 |
| 2015/0029775 A1* | 1/2015 | Ravasio | H01L 45/1666 | 365/63 |
| 2015/0084097 A1* | 3/2015 | Jeon | H01L 27/11807 | 257/206 |
| 2015/0340408 A1* | 11/2015 | Russo | H01L 27/2445 | 257/5 |
| 2015/0357381 A1* | 12/2015 | Terai | H01L 45/04 | 257/4 |
| 2016/0093674 A1* | 3/2016 | Asao | H01L 27/2463 | 365/148 |
| 2016/0099290 A1* | 4/2016 | Asao | H01L 45/085 | 257/4 |
| 2016/0104748 A1* | 4/2016 | Ravasio | H01L 45/1666 | 257/4 |
| 2016/0163593 A1* | 6/2016 | Tsukamoto | H01L 21/76897 | 438/382 |
| 2016/0300884 A1* | 10/2016 | Grenouillet | H01L 45/08 | |
| 2017/0110659 A1* | 4/2017 | Noda | H01L 27/2481 | |
| 2017/0221965 A1* | 8/2017 | Russo | H01L 27/2445 | |
| 2018/0205016 A1* | 7/2018 | Noda | H01L 27/2481 | |

* cited by examiner

SEMICONDUCTOR DEVICE AND METHOD OF MANUFACTURING THE SAME

CROSS-REFERENCE TO RELATED APPLICATION

The present application claims priority under 35 U.S.C 119(a) to Korean Patent Application No. 10-2017-0053927, filed on Apr. 26, 2017, which is incorporated by reference herein its entirety.

BACKGROUND

1. Technical Field

Various embodiments of the present disclosure generally relate to a semiconductor device and a method of manufacturing the same.

2. Related Art

Generally, a semiconductor can be manufactured by forming a conductive film or an insulating film on a substrate and patterning the conductive film or the insulating film. As a method of patterning the film, a damascene method using a chemical mechanical polishing process has been frequently applied.

Recently, research is being conducted to precisely control the chemical mechanical polishing process. Specifically, techniques for controlling a chemical reaction between polishing slurry and a film to be polished and techniques for improving the polishing reliability for the film have been studied.

SUMMARY

There is provided a method of manufacturing a semiconductor device according to an aspect of the present disclosure. In the method, a substrate that includes a cell region and a dummy region is provided. Lower interconnection structures are formed in the cell region and the dummy region. One or more first multilayered structure patterns are formed in the cell region and one or more second multilayered structure patterns in the dummy region over the lower interconnection structures. The first multilayered structure patterns and the second multilayered structure patterns extend in a first direction that is parallel to a top surface of the substrate. Each of the second multilayered structure patterns includes an etch target layer. An insulating material layer is formed over the first multilayered structure patterns and the second multilayered structure patterns. An interlayer insulating layer that fills a space between two adjacent patterns of the first multilayered structure patterns and second multilayered structure patterns is formed by chemically and mechanically polishing the insulating material layer. The etch target layer in each of the second multilayered structure patterns is removed.

There is provided a method of manufacturing a semiconductor device according to another aspect of the present disclosure. In the method, a substrate that includes a cell region and a dummy region is provided. Lower interconnection structures are formed over the substrate. Each of the lower interconnection structures include a first interconnecting layer disposed in the cell region and a second interconnecting layer disposed in the dummy region. First multilayered structure patterns in the cell region and second multilayered structure patterns in the dummy region are formed over the lower interconnection structures. Each of the first multilayered structure patterns and each of the second multilayered structure patterns extend in a first direction and have an electrical conduction path in a second direction. The first direction is parallel to a top surface of the substrate and the second direction is perpendicular to the top surface of the substrate. An insulating material layer is formed over the first multilayered structure patterns and the second multilayered structure patterns. The insulating material layer is chemically and mechanically polished to form an interlayer insulating layer that fills a space between two adjacent patterns of the first multilayered structure patterns and second multilayered structure patterns. At least one layer of each of the second multilayered structure patterns are removed to selectively block the electrical conduction path of each of the second multilayered structure patterns in the second direction.

There is provided a semiconductor device according to another aspect of the present disclosure. The semiconductor device includes a substrate including a cell region and a dummy region, lower interconnection structures disposed in the cell region and the dummy region. The semiconductor device includes a plurality of first conductive lines extending in a first direction and electrically coupled to the lower interconnection structures in the cell region. The semiconductor device includes a plurality of first dummy conductive lines extending in the first direction and electrically coupled to the lower interconnection structures in the dummy region. The semiconductor device includes a plurality of second conductive lines extending in a second direction that intersects with the first direction. The semiconductor device includes a plurality of first pillar-shaped structures disposed between the first conductive lines and the second conductive lines, and a plurality of second pillar-shaped structures disposed between the first dummy conductive lines and the second conductive lines. Each of the second pillar-shaped structures comprises a void.

DETAILED DESCRIPTION

Figure 1A:
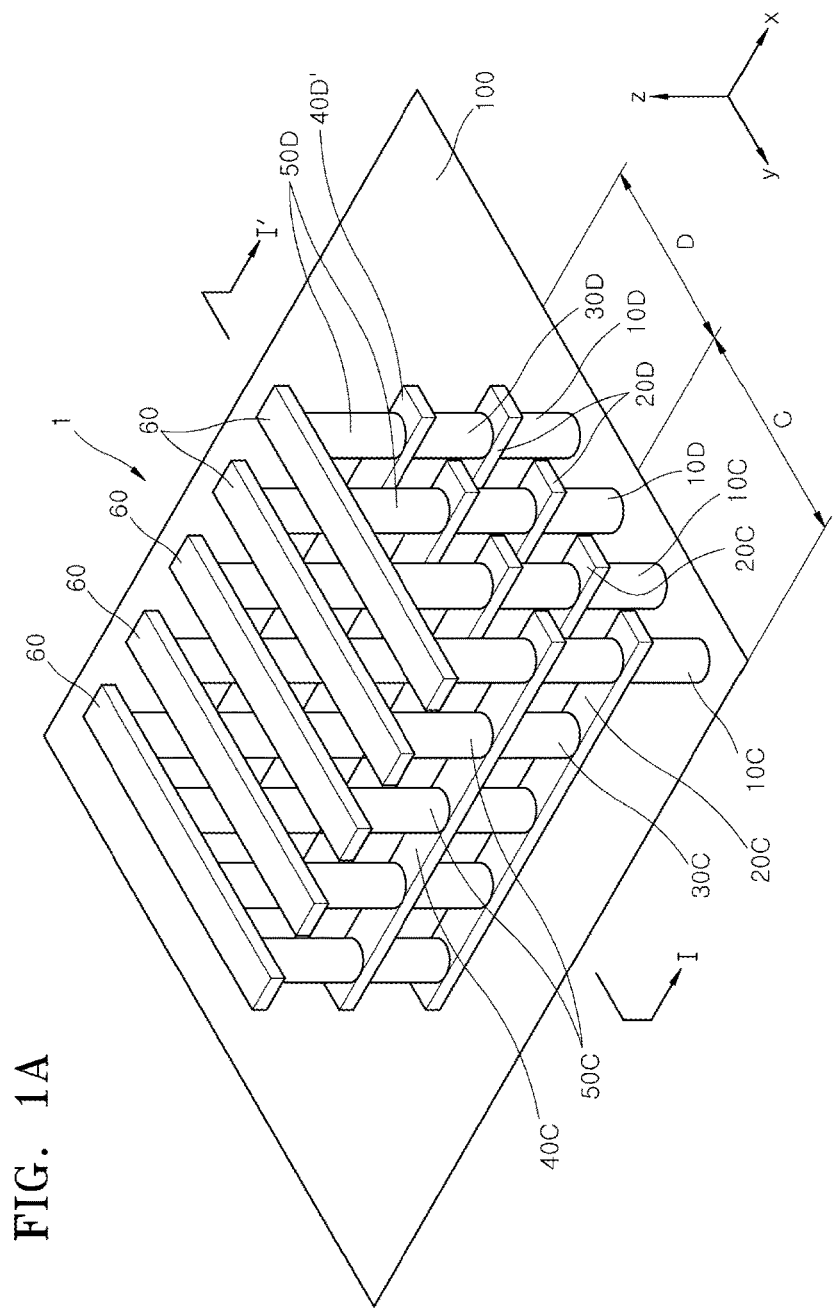
FIGS. 1A and 1B are views illustrating a semiconductor device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

Figure 1B:
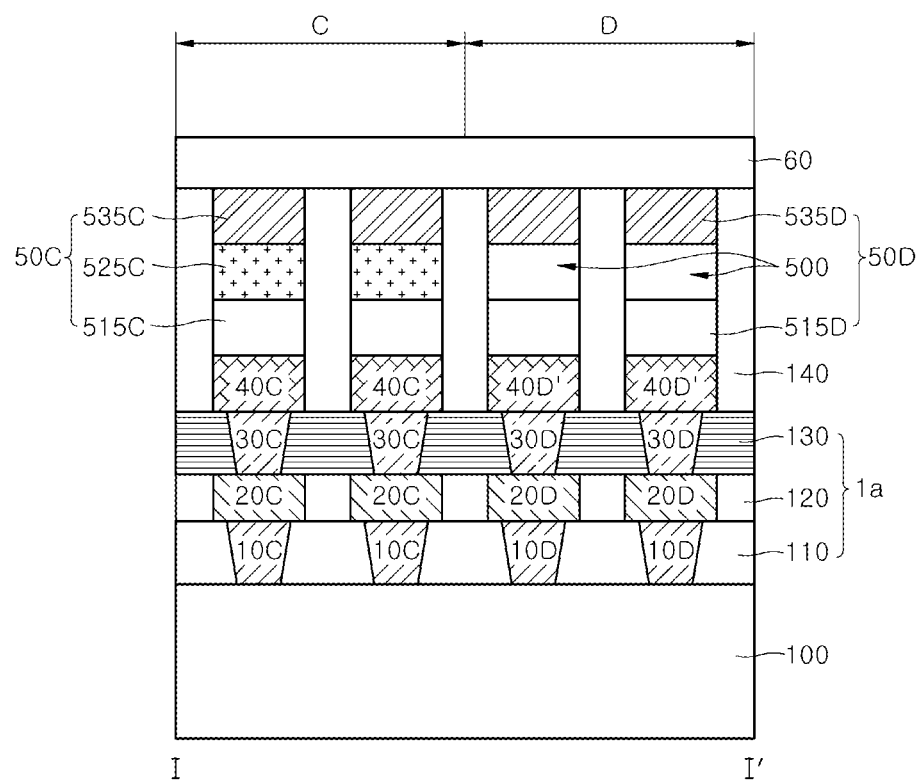

FIGS. 1A and 1B illustrate a semiconductor device 1 according to an embodiment of the present disclosure. More specifically, FIG. 1A is a perspective view illustrating the semiconductor device 1, and FIG. 1B is a cross-sectional view taken along line I-I' of FIG. 1A. For the convenience of illustration, an interlayer insulating layer is omitted in the perspective view of FIG. 1A.

Referring to FIGS. 1A and 1B, the semiconductor device 1 may include a substrate 100 in which a cell region C and a dummy region D are defined. The substrate 100 may be any of a silicon (Si) substrate, a gallium arsenide (GaAs) substrate, an indium phosphide (InP) substrate, a germanium (Ge) substrate, a silicon germanium (SiGe) substrate, and a silicon-on-insulator (SOI) substrate, as non-limiting examples. The substrate 100 may be doped with an n-type dopant or a p-type dopant. The substrate 100 may include a well at least partially doped with the n-type dopant or the p-type dopant.

Lower interconnection structures 1a may be disposed on the substrate 100, each of the lower interconnection structure 1a including one or more interconnecting layers (or interconnection layers) 10C, 10D, 20C, 20D, 30C, and 30D and one or more insulating layers 110, 120, and 130. In an embodiment, the lower interconnection structures 1a may be disposed in the cell region C and the dummy region D. One or more first plugs 10C, one or more first interconnection layers 20C, and one or more second plugs 30C, which are sequentially stacked over the substrate 100, may be disposed in the cell region C. One or more first dummy plugs 10D, one or more first dummy interconnection layers 20D, and one or more second dummy plugs 30D, which are sequentially stacked on the substrate 100, may be disposed in the dummy region D. Also, the first interlayer insulating layer 110 that electrically insulates the first plugs 10C and the first dummy plugs 10D from each other, the second interlayer insulating layer 120 that electrically insulates the first interconnection layers 20C and the first dummy interconnection layers 20D from each other, and the third interlayer insulating layer 130 that electrically insulates the second plugs 30C and the second dummy plugs 30D from each other, may be disposed in the cell region C and the dummy region D.

In an embodiment, in the cell region C and the dummy region D, the lower interconnection structures 1a may include the interconnecting layers 10C, 10D, 20C, 20D, 30C, and 30D having substantially the same density. For example, a ratio of a total area of the first plugs 10C to the area of the cell region C is substantially equal to a ratio of a total area of the first dummy plugs 10D to the area of the dummy region D. For another example, a ratio of a total area of the first interconnection layers 20C to an area of the cell region C is substantially equal to a ratio of a total area of the first dummy interconnection layers 20D to an area of the dummy region D. For another example, a ratio of a total area of the second plugs 30C to an area of the cell region C is substantially equal to a ratio of a total area of the second dummy plugs 30D to the area of the dummy region D. The lower interconnection structures 1a disposed in the cell region C and the dummy region D may be electrically connected to the substrate 100. As illustrated in FIGS. 1A and 1B, the first plug 10C and the first dummy plug 10D may electrically connect the first interconnecting layer 20C and the first dummy interconnecting layer 20D to the substrate 100, respectively. Densities of the first plugs 10C and the first dummy plugs 10D may be lower than those of the second plug 30C and the second dummy plug 30D, but embodiments of the present disclosure are not limited thereto. In another embodiment, the densities of the first plug 10C and the first dummy plug 10D may be equal to or higher than those of the second plug 30C and the second dummy plug 30D.

In FIGS. 1A and 1B, a two-layer structure including the first plugs 10C, the first dummy plugs 10D, the second plugs 30C and the second dummy plugs 30D and a single-layer structure including the first interconnecting layers 20C and the first dummy interconnecting layer 20D are illustrated as the lower interconnection structures 1a, but embodiments of the present disclosure are not limited thereto. For example, the lower interconnection structures 1a may have a multi-layer structure, which is different from the three-layer structure shown in FIGS. 1A and 1B.

A plurality of first conductive lines 40C and a plurality of first dummy conductive lines 40D' extending in a first direction (e.g., a direction parallel to the x direction shown in FIG. 1A) may be disposed in the cell region C and the dummy region D, respectively, over the lower interconnection structures 1a. The first conductive lines 40C and the first dummy conductive lines 40D' may be electrically connected to the second plugs 30C and the second dummy plugs 30D, respectively.

A plurality of second conductive lines 60 extending in a second direction (e.g., a direction parallel to the y direction shown in FIG. 1A) that is not parallel to the first direction may be disposed over the first conductive lines 40C and the first dummy conductive lines 40D'. A plurality of pillar-shaped structures 50C and a plurality of dummy pillar-shaped structures 50D may be disposed between the first conductive lines 40C and the second conductive lines 60 and between the first dummy conductive lines 40D' and the second conductive lines 60, respectively. More specifically, in the cell region C, each of the cell pillar-shaped structures 50C may be disposed in a region where one of the first conductive lines 40C and a corresponding one of the second conductive lines 60 intersect, and in the dummy region D, each of the dummy pillar-shaped structures 50D may be disposed in a region where one of the first dummy conductive lines 40D' and a corresponding one of the second conductive lines 60 intersect.

Each of the cell pillar-shaped structures 50C may include a unit cell device in the cell region C. For example, the unit cell device may be a nonvolatile memory device. The nonvolatile memory device may include any of a resistive random access memory (RRAM) device, a ferroelectric random access memory (FRAM) device, a phase change random access memory (PCRAM) device, and a magnetic random access memory (MRAM) device, as non-limiting examples.

In an embodiment, as illustrated in FIG. 1B, the cell pillar-shaped structure 50C may include an RRAM device as a unit cell device. The cell pillar-shaped structure 50C may include a lower electrode layer 515C, a resistance change memory layer (or a resistive memory layer) 525C, and an upper electrode layer 535C. The resistance change memory layer 525C may include a variable resistance material whose electrical resistance is switched between a high resistance state and a low resistance state according to an externally applied voltage. In an embodiment, the resistance change memory layer 525C may include a metal oxide, such as any of titanium oxide, aluminum oxide, nickel oxide, copper oxide, zirconium oxide, manganese oxide, hafnium oxide, tungsten oxide, tantalum oxide, niobium oxide, iron oxide, and the like, as non-limiting examples. In another embodiment, the resistance change memory layer 525C may include a Perovskite material, such as any of PCMO ($Pr_{0.7}Ca_{0.3}MnO_3$), LCMO($La_{1-x}Ca_xMnO_3$), BSCFO ($Ba_{0.5}Sr_{0.5}Co_{0.8}Fe_{0.2}O_{3-\delta}$), YBCO($YBa_2Cu_3O_{7-x}$), (Ba, Sr)$TiO_3$(Cr, Nb-doped), $SrZrO_3$(Cr, V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, and the like, as non-limiting examples. In yet another embodiment, the resistance change memory layer 525C may include a selenide-based material, such as $Ge_xSe_{1-x}$(Ag, Cu, Te-doped), or a metal sulfide, such as $Ag_2S$, $Cu_2S$, CdS, ZnS, or the like, as non-limiting examples.

The lower electrode layer 515C and the upper electrode layer 535C may include a metal, a conductive nitride, or the like. The lower electrode layer 515C and the upper electrode 535C may include any of aluminum (Al), tungsten (W), titanium nitride (TiN), tungsten nitride (WN), and the like, as non-limiting examples.

As illustrated in FIG. 1B, the dummy pillar-shaped structure 50D may have substantially the same configuration as the cell pillar-shaped structure 50C except that the dummy pillar-shaped structure 50D includes a void 500 instead of the resistance change memory layer 525C. For example, the dummy pillar-shaped structure 50D may have a dummy lower electrode layer 515D, a dummy upper electrode layer 535D, and the void 500 positioned between the dummy lower electrode layer 515D and the dummy upper electrode layer 535D.

The void 500 can substantially block electrical conduction in a specific direction (e.g., the vertical direction perpendicular to a top surface of the substrate 100) in the dummy pillar-shaped structure 50D. For example, even if a voltage is applied between the first dummy conductive line 40D' and the second conductive line 60 or between the substrate 100 and the second conductive line 60, the electrical conduction in the vertical direction via the dummy pillar-shaped structure 50D can be suppressed in the dummy region D.

In some other embodiments (not illustrated), in the dummy pillar-shaped structure 50D, a void (not shown) may be formed in place of at least one of the dummy lower electrode layer 515D and the dummy upper electrode layer 535D, rather than a resistance change memory layer. In this case, the dummy pillar-shaped structure 50D may include a layer (not shown) that is substantially the same as the resistance change memory layer 525C of the cell pillar-shaped structure 50C. In some other embodiments (not illustrated), in the dummy region D, a void (not shown) may fill the entire dummy pillar-shaped structure 50D. That is, the dummy pillar-shaped structure 50D includes a void only and does not include any layers corresponding to the lower electrode layer 515C, the resistance change memory layer 525C, and the upper electrode layer 535C of the cell pillar-shaped structure 50C.

Figure 2A:
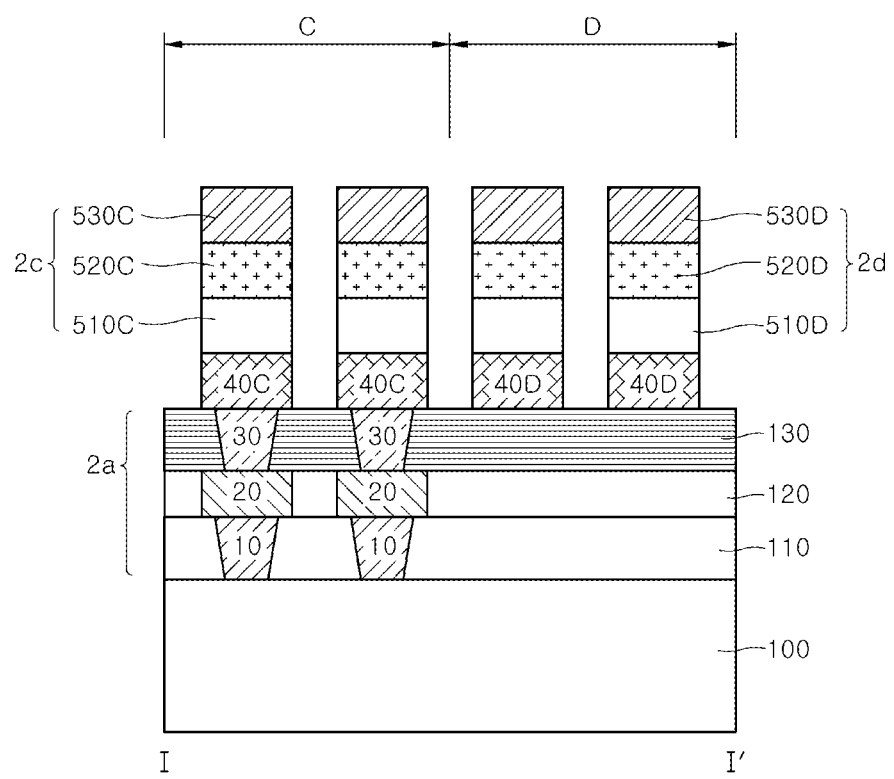
FIGS. 2A to 2C are cross-sectional views illustrating a method of manufacturing a semiconductor device as a comparative example of the present disclosure.
Figure 2B:
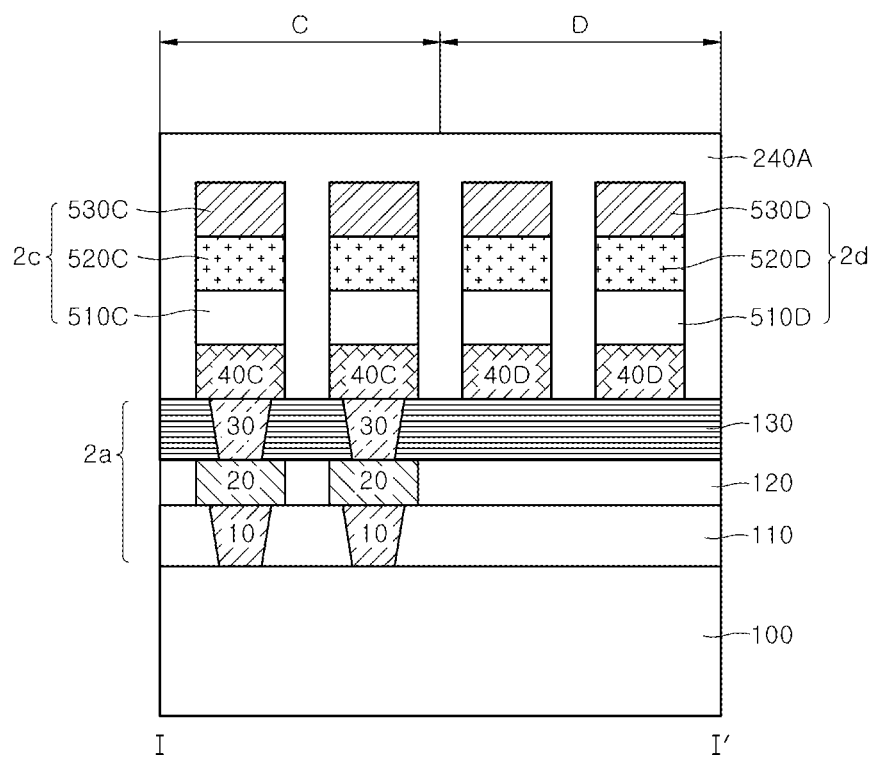

FIGS. 2A and 2B illustrate a method of manufacturing a semiconductor device 2 as a comparative example of the present disclosure. The semiconductor device 2 manufactured through the comparative example may be structurally unreliable, as compared with the semiconductor device 1 according to the embodiment illustrated in FIGS. 1A and 1B.

Referring to FIG. 2A, a substrate 100 in which a cell region C and a dummy region D are defined may be provided. A lower interconnection structure 2a may be disposed on the substrate 100. The lower interconnection structure 2a may include a first plug 10, a first interconnecting layer 20, a second plug 30, and first, second, and third interlayer insulating layers 110, 120, and 130. Here, the first plug 10, the first interconnecting layer 20, and the second plug 30 may be disposed only in the cell region C. The first, second, and third interlayer insulating layers 110, 120, and 130 may be disposed in the cell region C and the dummy region D.

First conductive lines 40C and first dummy conductive lines 40D extending in an x direction may be disposed on the second plugs 30 and the third interlayer insulating layer 130. A plurality of multilayered structure patterns 2c and a plurality of dummy multilayered structure patterns 2d extending in the x direction may be disposed on the first conductive lines 40C and the first dummy conductive lines 40D, respectively. The multilayered structure patterns 2c in the cell region C may include lower electrode patterns 510C, memory film patterns 520C, and upper electrode patterns 530C. The dummy multilayered structure patterns 2d in the dummy region D may include dummy lower electrode patterns 510D, dummy memory film patterns 520D, and dummy upper electrode patterns 530D.

The multilayered structure pattern 2c in the cell region C may be electrically connected to the first interconnecting layer 20 through the first conductive line 40C and the second plug 30. The multilayered structure pattern 2c in the cell region C may be electrically connected to the substrate 100 through the first conductive line 40C, the first and second plugs 10 and 30, and the first interconnecting layer 20.

Referring to FIG. 2B, an insulating material layer 240A covering side and upper surfaces of the multilayered structure patterns 2c and the dummy multilayered structure patterns 2d may be formed over the third interlayer insulating layer 130. The multilayered structure patterns 2c and the dummy multilayered structure patterns 2d may be electrically insulated from each other by the insulating material layer 240A.

Figure 2C:
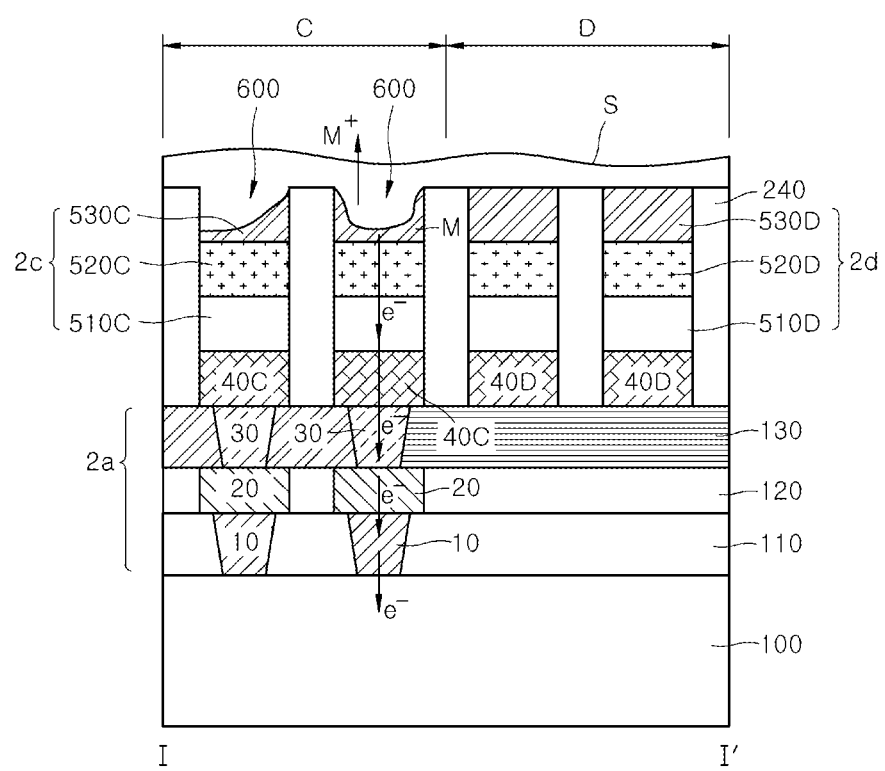

Referring to FIG. 2C, the insulating material layer 240A in FIG. 2B may be chemically and mechanically polished using polishing slurry S to form an interlayer insulating layer 240, which exposes upper surfaces of the upper electrode patterns 530C of the multilayered structure patterns 2c and upper surfaces of the dummy upper electrode patterns 530D of the dummy multilayered structure patterns 2d. The interlayer insulating layer 240 may be polished, so that an upper surface of the interlayer insulating layer 240 is to be located substantially in the same plane as the upper surfaces of the dummy upper electrode patterns 530D.

However, in the cell region C and the dummy region D, an undesired corrosion reaction may occur between the polishing slurry S and the exposed upper electrode patterns 530C and 530D. As a result, for example, at least a portion of the upper electrode pattern 530C in the cell region C may be removed and a recess 600 may be formed in the upper electrode pattern 530C.

Although embodiments of the present disclosure are not limited by a specific theory, the corrosion reaction may occur by, e.g., an oxidation-reduction reaction in which the polishing slurry S functions as an electrolytic solution. Specifically, the upper electrode pattern 530C may function as an electrode active material for generating metal ions and electrons by an oxidation reaction, and the lower interconnection structure 2*a* and the substrate 100, which are electrically connected to the upper electrode pattern 530C, may function as a reduction reaction source consuming the generated electrons.

Referring to FIG. 2C again, a metal M included in the upper electrode pattern 530C in the cell region C may be oxidized and dissolved by the polishing slurry S as metal ions $M^+$ to thereby generate electrons $e^-$. In contrast to the dummy region D, the cell region C may have the lower interconnection structure 2*a* that functions as an electrical conduction path of the generated electrons $e^-$. The lower interconnection structure 2*a* may consume the electrons $e^-$, or the substrate 100 electrically connected to the lower interconnection structures 2*a* may function as a reduction reaction source consuming the electrons $e^-$, thereby continuing the oxidation reaction of the upper electrode pattern 530C. As a result, in the upper electrode pattern 530C, the non-uniform recess 600 may be formed by the oxidation reaction.

On the contrary, in the dummy region D having no lower interconnection structure, even assuming that a metal included in the dummy upper electrode pattern 530D can be oxidized to generate electrons, a reduction reaction source in the dummy region D would consume a relatively low amount of the generated electrons by the oxidation of the metal M, as compared with that the cell region C. Therefore, the oxidation reaction of the dummy upper electrode pattern 530D in contact with the polishing slurry S can be relatively suppressed compared with that of the upper electrode pattern 530C.

As described above, according to the comparative example, after the chemical mechanical polishing process is performed on the insulating material film 240A to form the interlayer insulating layer 240, a variation between a thickness of the upper electrode pattern 530C in the cell region C and a thickness of the dummy upper electrode pattern 530D in the dummy region D may be generated. As a result, the unit cell device disposed in the cell region C may have defects in the device structure.

Figure 3:
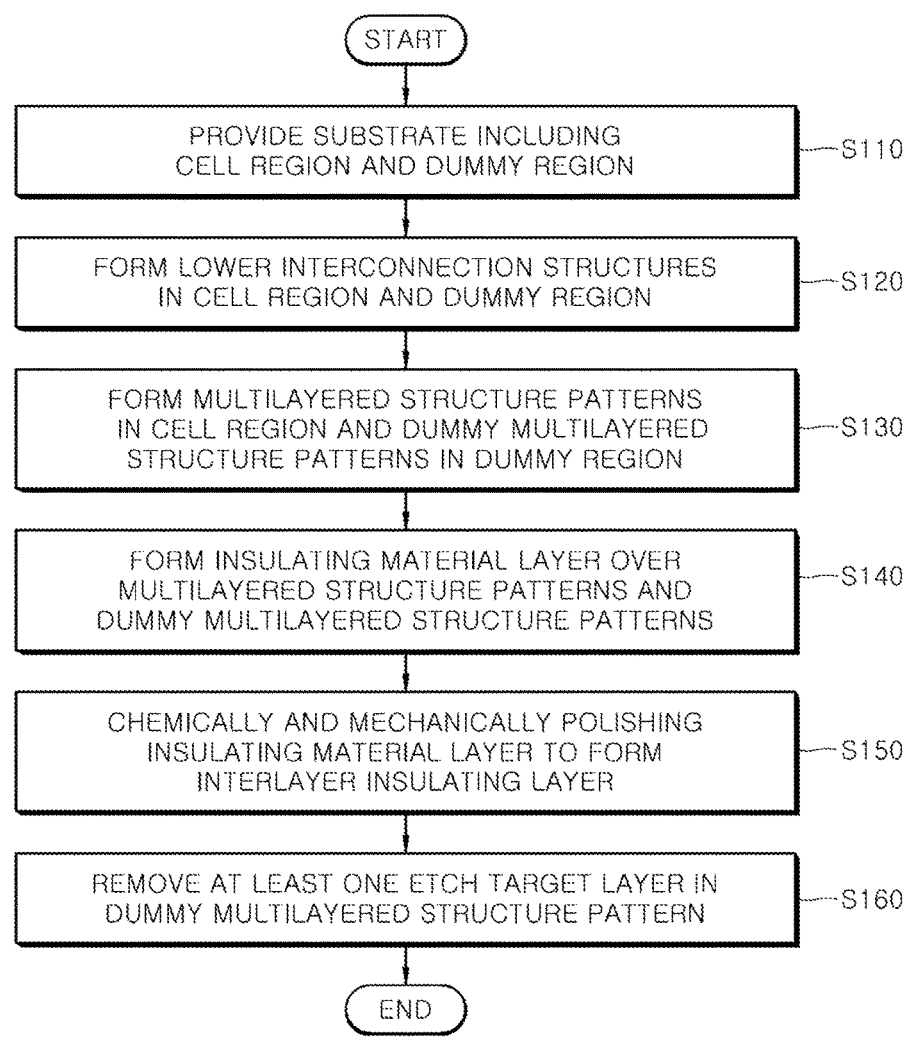
FIG. 3 is a flow chart illustrating a method of manufacturing a semiconductor device according to an embodiment of the present disclosure.

FIG. 3 is a flow chart illustrating a method of manufacturing a semiconductor device according to an embodiment of the present disclosure.

Referring to FIG. 3, at step S110, a substrate including a cell region and a dummy region may be provided. The substrate may be a semiconductor substrate.

At step S120, lower interconnection structures may be formed in the cell region and the dummy region. Each of the lower interconnection structures includes one or more interconnecting layers and one or more insulating layers. In an embodiment, densities of the interconnecting layers may be substantially the same in the cell region and in the dummy region.

At step S130, one or more multilayered structure patterns in the cell region and one or more dummy multilayered structure patterns in the dummy region may be formed over the lower interconnection structures. The multilayered structure patterns and the dummy multilayered structure patterns extend in a first direction, and each of the dummy multilayered structure patterns includes an etch target layer. Each of the multilayered structure patterns and the dummy multilayered structure patterns may be electrically connected to a corresponding interconnecting layer. The etch target layer may include a conducting material or a variable resistance material. Each of the multilayered structure patterns and the dummy multilayered structure patterns may have an electrical conduction path in a second direction (e.g., a vertical direction perpendicular to a top surface of the substrate).

At step S140, an insulating material layer may be formed over the multilayered structure patterns and dummy multilayered structure patterns. Thus, the multilayered structure patterns and the dummy multilayered structure patterns may be electrically insulated from each other by the insulating material layer.

At step S150, the insulating material layer may be chemically and mechanically polished to form an interlayer insulating layer. The interlayer insulating layer fills a space between two adjacent patterns of the multilayered structure patterns and the dummy multilayered structure patterns. At this time, an upper surface of the interlayer insulating layer may be located on substantially the same plane as upper surfaces of the multilayered structure patterns and upper surfaces of the dummy multilayered structure patterns. By the chemical mechanical polishing process, conductive layers of the multilayered structure patterns may be exposed. In an embodiment, each of the multilayered structure patterns includes an upper electrode pattern, and each of the dummy multilayered structure patterns includes a dummy upper electrode pattern, and the chemical and mechanical polishing process may be performed to expose upper surfaces of the upper electrode patterns of the multilayered structure patterns and upper surfaces of the dummy upper electrode patterns of the dummy multilayered structure patterns.

At step S160, the etch target layer in each of the dummy multilayered structure patterns located in the dummy region may be removed. The step of removing the etch target layer may form a void in each of the dummy multilayered structure patterns to substantially remove the electrical conduction path in the second direction.

In an embodiment, the step of removing the etch target layer may include forming a dummy open mask pattern that exposes at least a portion of the dummy multilayered structure patterns and at least a portion of the interlayer insulating layer, forming etched dummy multilayered structure patterns by etching the dummy multilayered structure patterns to expose side surfaces of the etched dummy multilayered structure patterns, and providing an etchant having an etch selectivity between the etch target layer and other layers on the exposed side surfaces of the etched dummy multilayered structure patterns to remove the etch target layer along the first direction. As a result, voids may be formed in the etched dummy multilayered structure patterns, and the voids are disposed along the first direction. By removing the etch target layer, the electrical conduction path of each the dummy multilayered structure patterns in the second direction can be blocked.

By performing the above-described processes from steps S110 to S160, it is possible to manufacture a semiconductor device in which a thickness variation between the multilayered structure patterns in the cell region and the dummy multilayered structure patterns in the dummy region is suppressed. In addition, by removing the etch target layer after the chemical mechanical polishing, it is possible to block the electrical conduction path of each of the dummy multilayered structure patterns in the second direction.

Further, according to embodiments of the present disclosure, after removing the etch target layer, resulting structures in the cell region and in the dummy region can have substantially equal heights. As a result, one or more subsequent semiconductor manufacturing processes can be performed relatively easily.

FIGS. 4A, 5A, 6A, 7A, 8A, 9A, 10A, 11A, 12A, and 13A are plan views illustrating a method of manufacturing a semiconductor device according to an embodiment of the present disclosure. FIGS. 4B, 5B, 6B, 7B, 8B, 9S, 10B, 11S, 12B, and 13S are cross-sectional views taken along line A-A' in the plan view of FIGS. 4A to 13A, respectively. FIGS. 4C, 5C, 6C, 7C, 8C, 9C, 10C, 11C, 12C, and 13C are cross-sectional views taken along line B-B' in the plan view of FIGS. 4A to 13A, respectively. Hereinafter, the semiconductor device described below with reference to FIGS. 4A to 13C may be a semiconductor device including a cell pillar-shaped structure and a dummy pillar-shaped structure as described above with reference to FIGS. 1A and 1B. A cell unit device formed in the cell pillar-shaped structure may be a nonvolatile memory device such as an RRAM device. However, in some other embodiments, the cell unit device may be not limited to the RRAM device, but may be an FRAM device, a PCRAM device, or a MRAM device, each of which has a variable resistance layer disposed between a pair of electrode layers.

Figure 4A:
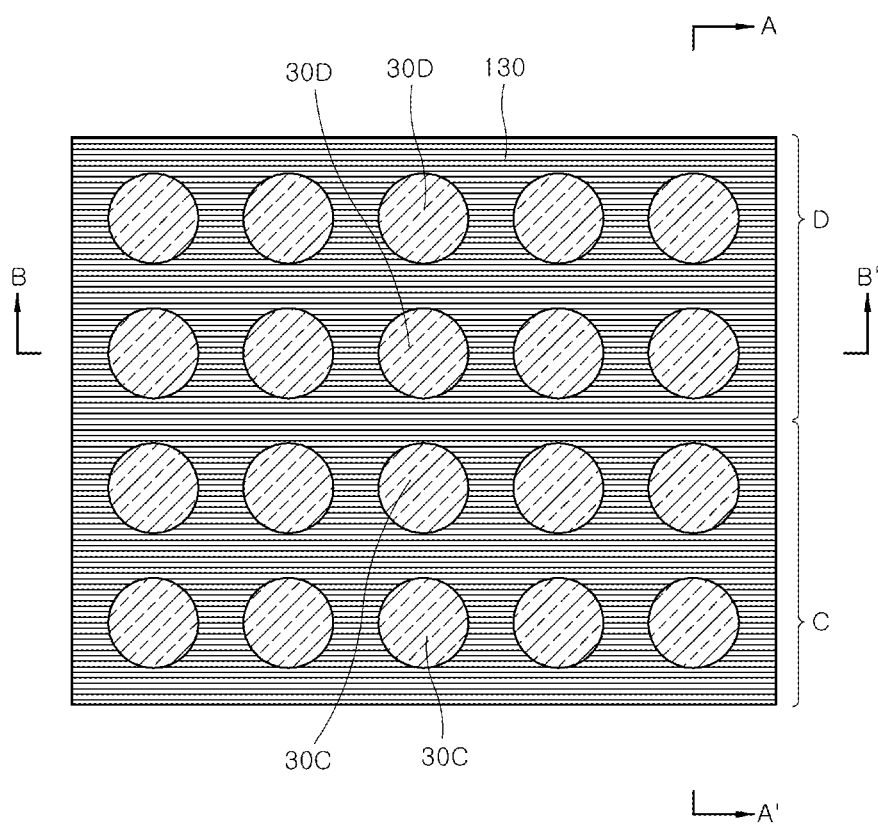
FIGS. 4A, 5A, 6A, 7A, 8A, 9A, 10A, 11A, 12A, and 13A are plan views illustrating a method of manufacturing a semiconductor device according to an embodiment of the present disclosure.
Figure 4B:
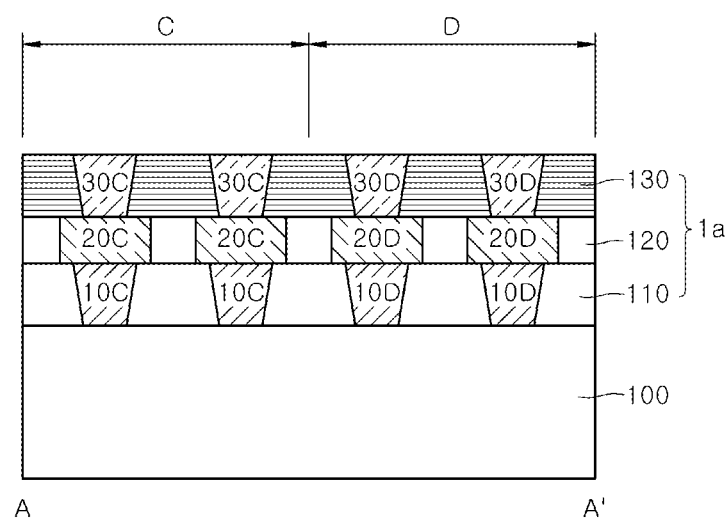
FIGS. 4B, 5B, 6B, 7B, 8B, 9B, 10B, 11B, 12B, and 13B are cross-sectional views taken along line A-A' of FIGS. 4A, 5A, 6A, 7A, 8A, 9A, 10A, 11A, 12A, and 13A, respectively.
Figure 4C:
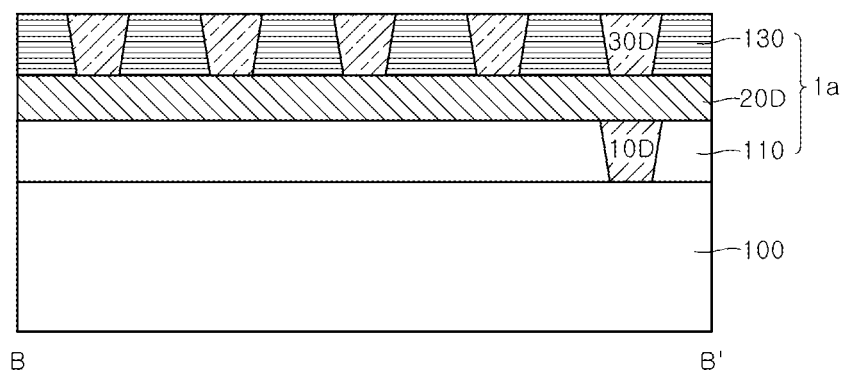
FIGS. 4C, 5C, 6C, 7C, 8C, 9C, 10C, 11C, 12C, and 13C are cross-sectional views taken along line B-B' of FIGS. 4A, 5A, 6A, 7A, 8A, 9A, 10A, 11A, 12A, and 13A, respectively.

Referring to FIGS. 4A, 4B, and 4C, a substrate 100 including a cell region C and a dummy region D may be prepared. The substrate 100 may be a semiconductor substrate, as a non-limiting example. Specifically, the substrate 100 may be any of a silicon (Si) substrate, a gallium arsenide (GaAs) substrate, an indium phosphide (InP) substrate, a germanium (Ge) substrate, a silicon germanium (SiGe) substrate, and a silicon-on-insulator (SOI) substrate, as non-limiting examples. The substrate 100 may be doped with an n-type dopant or a p-type dopant. The substrate 100 may include a well at least partially doped with the n-type dopant or the p-type dopant.

Lower interconnection structures 1a may be disposed on the substrate 100. Each of the lower interconnection structures 1a may include one or more interconnecting layers 10C, 10D, 20C, 20D, 30C, and 30D, and one or more insulating layers 110, 120, and 130. In an embodiment, the lower interconnection structures 1a may be formed in the cell region C and the dummy region D. In the cell region C, one or more first plugs 10C, one or more first interconnecting layers 20C, and one or more second plugs 30C may be sequentially formed over the substrate 100. In the dummy region D, one or more first dummy plugs 10D, one or more first dummy interconnecting layers 20D, and one or more second dummy plugs 30D may be sequentially formed over the substrate 100. Also, the first interlayer insulating layer 110 insulates the first plugs 10C and first dummy plugs 10D from each other, a second interlayer insulating layer 120 insulates the first interconnecting layers 20C and first dummy interconnecting layers 20D from each other, and a third interlayer insulating layer 130 insulates the second plugs 30C and the second dummy plugs 30D from each other, and the first, second, and third interlayer insulating layers 110, 120, and 130 may be formed in the cell region C and the dummy region D.

The lower interconnection structures 1a may be formed by applying semiconductor fabrication processes. For example, a chemical vapor deposition method, a sputtering method, an atomic layer deposition method, a coating method, or the like may be applied to deposit a film or layer. In an embodiment, a patterning process including lithography and etching may be applied to the deposited film or layer. In another embodiment, a patterning process such as a damascene process may be performed using the deposited film or layer.

In an embodiment, densities of the interconnecting layers 10C, 10D, 20C, 20D, 30C, and 30D of the lower interconnection structures 1a may be substantially the same in the cell region C and in the dummy region D. The lower interconnection structures 1a disposed in the cell region C and the dummy region D may be electrically connected to the substrate 100. The first plug 10C and the first dummy plug 10D may electrically connect the substrate 100 to the first interconnecting layer 20C and the first dummy interconnecting layer 20D, respectively.

In the embodiment shown in FIGS. 4A to 4C, the densities of the first plugs 10C and the first dummy plugs 10D may be lower than those of the second plugs 30C and the second dummy plugs 30D. For example, the numbers of the first plugs 10C and the first dummy plugs 10D are smaller than the numbers of the second plugs 30C and the second dummy plugs 30D. But, embodiments of the present disclosure are not limited thereto. In other embodiments, densities of the first plugs 10C and the first dummy plugs 10D may be equal to or greater than those of the second plugs 30C and the second dummy plugs 30D.

Referring to FIGS. 4A, 4B, and 4C again, the second plugs 30C, the second dummy plugs 30D, and the third interlayer insulating layer 130 may be planarized such that their upper surfaces are located on the same plane. As the planarization process, a chemical mechanical polishing process may be performed, as a non-limiting example.

Figure 5A:
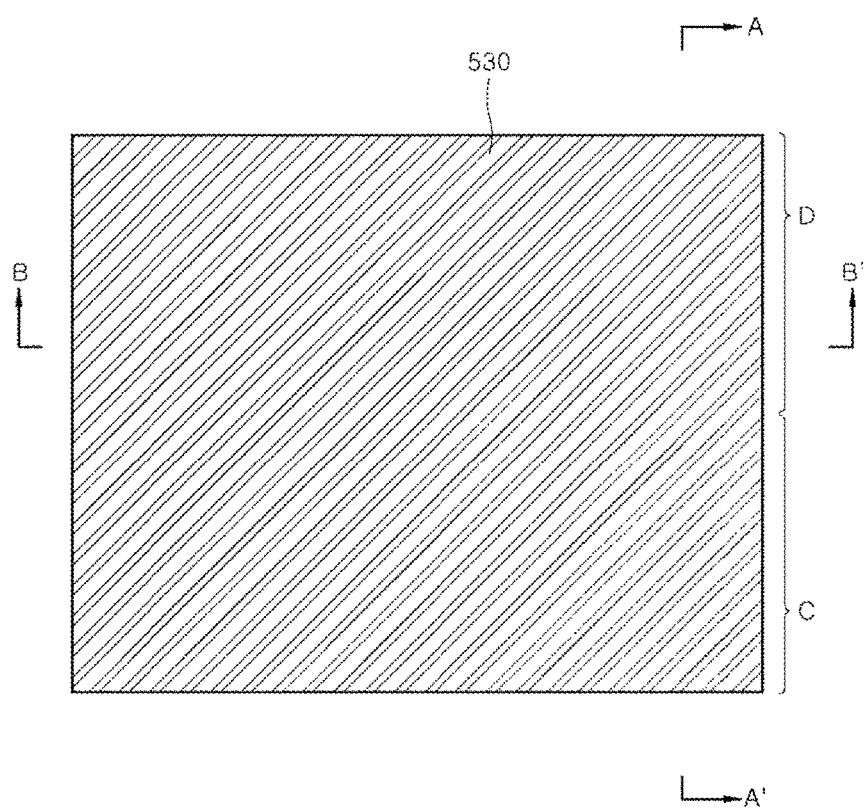
Figure 5B:
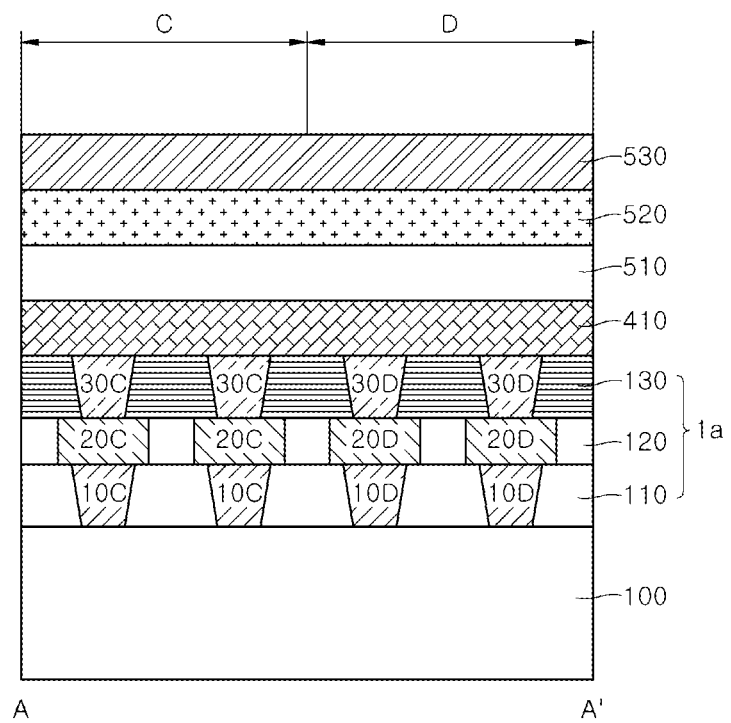
Figure 5C:
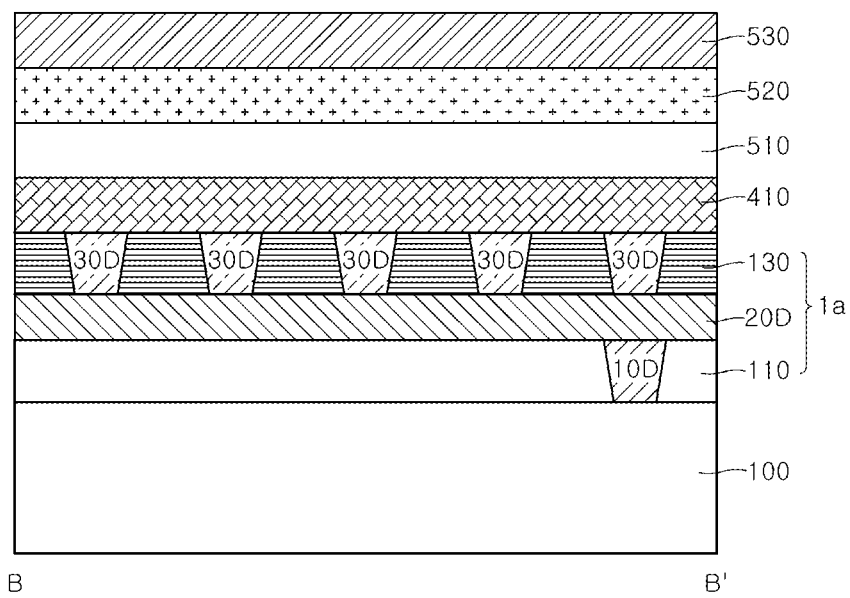

Referring to FIGS. 5A, 5B, and 5C, a stacked structure including a first conductive layer 410, a lower electrode layer 510, a resistive memory film 520, and an upper electrode layer 530 may be formed over the lower interconnection structures 1a. The first conductive layer 410, the lower electrode layer 510, the resistive memory film 520, and the upper electrode layer 530 may be formed by using any of a chemical vapor deposition method, a sputtering method, an atomic layer deposition method, and the like, as non-limiting examples.

The first conductive layer 410, the lower electrode layer 510, and the upper electrode layer 530 may include a metal or a conductive metal nitride, as non-limiting examples. In an embodiment, the metal may include aluminum (Al), titanium (Ti), tungsten (W), or the like. In another embodiment, the metal nitride may include titanium nitride (TiN), tungsten nitride (WN), or the like, as non-limiting examples.

In an embodiment, the resistive memory film 520 may include a metal oxide such as titanium oxide, aluminum oxide, nickel oxide, copper oxide, zirconium oxide, manganese oxide, hafnium oxide, tungsten oxide, tantalum oxide, niobium oxide, iron oxide, or the like, as non-limiting examples. In another embodiment, the resistive memory film 520 may include a Perovskite material, such as PCMO ($Pr_{0.7}Ca_{0.3}MnO_3$), LCMO($La_{1-x}Ca_xMnO_3$), BSCFO ($Ba_{0.5}Sr_{0.5}Co_{0.8}Fe_{0.2}O_{3-\delta}$), YBCO($YBa_2Cu_3O_{7-x}$), (Ba,Sr)$TiO_3$(Cr, Nb-doped), $SrZrO_3$(Cr,V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, or the like. In yet another embodiment, the resistive memory film 520 may include a selenide-based material such as $Ge_xSe_{1-x}$(Ag,Cu, Te-doped), or a metal sulfide such as $Ag_2S$, $Cu_2S$, CdS, or ZnS.

Figure 6A:
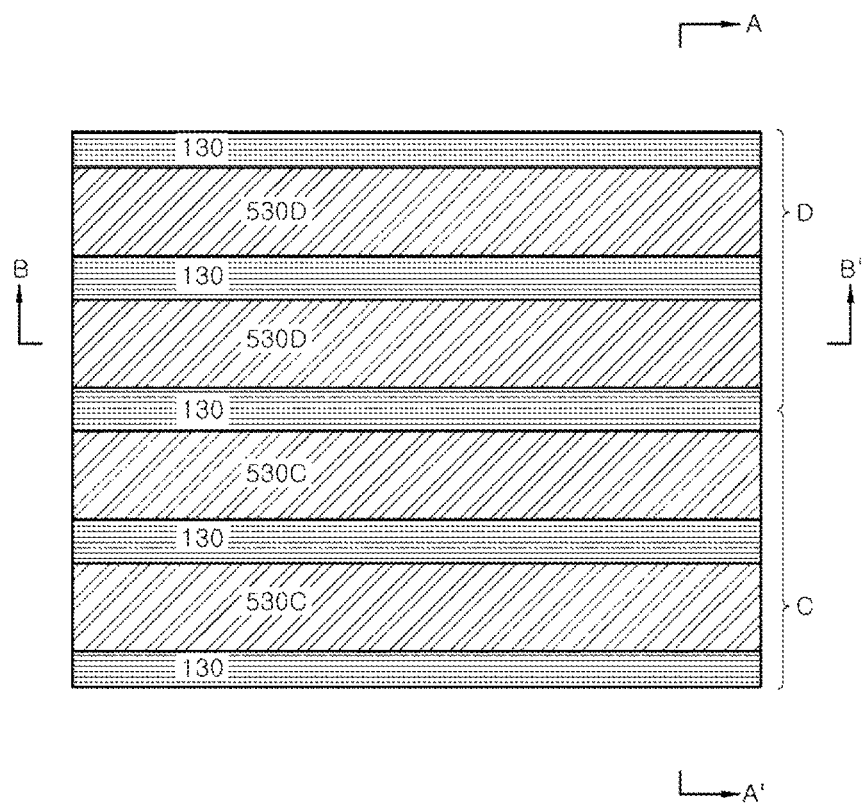
Figure 6B:
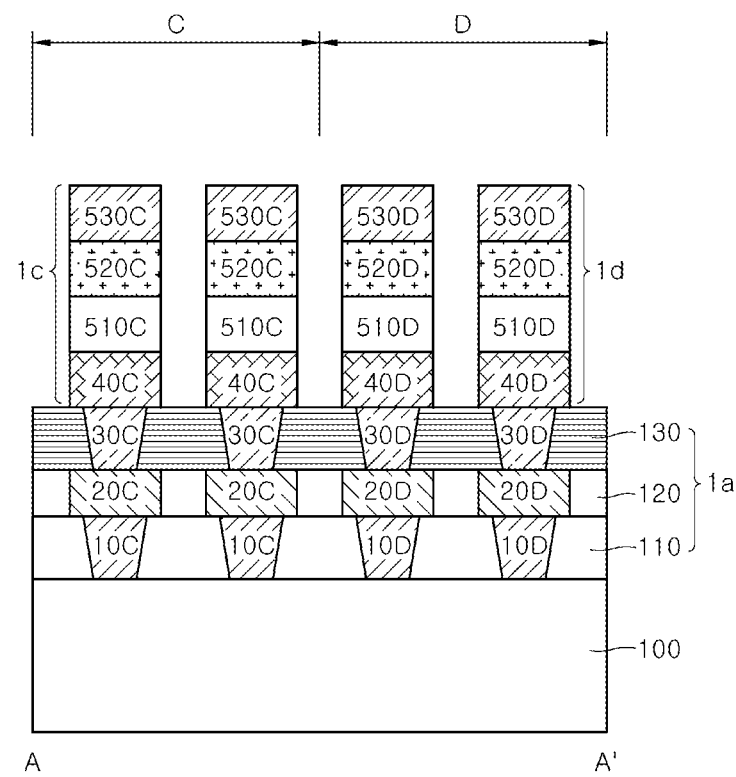
Figure 6C:
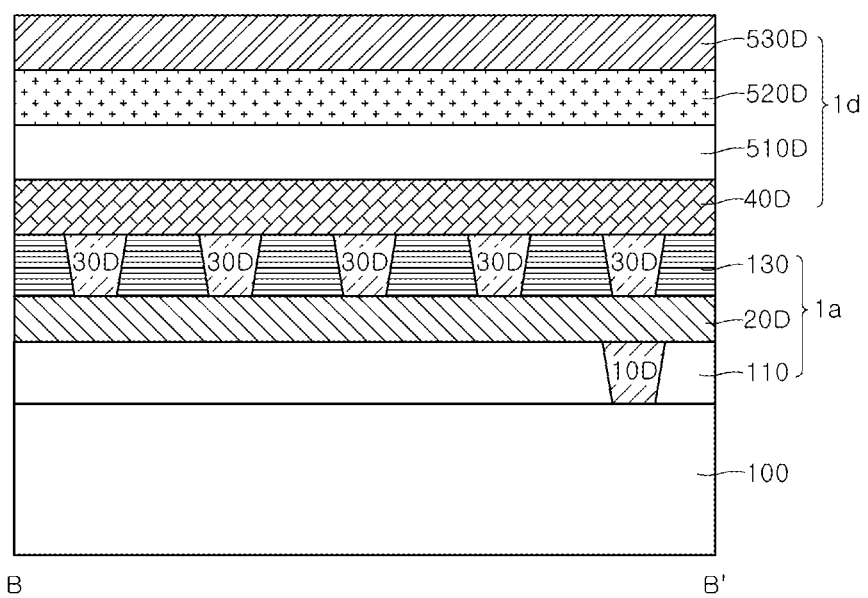

Referring to FIGS. 6A, 6B, and 6C, the stacked structure including the first conductive layer 410, the lower electrode layer 510, the resistive memory film 520, and the upper electrode layer 530 may be selectively etched to form stacked structure patterns, which are multilayered structure patterns 1c and dummy multilayered structure patterns 1d, each of which extends in a first direction (e.g., a direction parallel to a top surface of the substrate 100). Each of the multilayered structure patterns 1c may include a first conductive line 40C, a lower electrode pattern 510C, a memory film pattern 520C, and an upper electrode pattern 530C, which are sequentially stacked in the cell region C. Also, each of the dummy multilayered structure patterns 1d may include a first intermediate dummy conductive line 40D, a dummy lower electrode pattern 510D, a dummy memory film pattern 520D, and a dummy upper electrode pattern 530D, which are sequentially stacked in the dummy region D.

Each of the multilayered structure patterns 1c and the dummy multilayered structure patterns 1d may have an electrical conductance in a second direction (e.g., a direction perpendicular to the top surface of the substrate 100). Specifically, each of the multilayered structure patterns 1c and the dummy multilayered structure patterns 1d has an electrical conduction path in the second direction. In other words, since the first conductive lines 40C and the first intermediate dummy conductive lines 40D, the lower electrode patterns 510C and the dummy lower electrode patterns 510D, and the upper electrode patterns 530C and the dummy upper electrode patterns 530D are electrically conductive, and the memory film patterns 520C and the dummy memory film patterns 520D are electrically resistive, the multilayered structure patterns 1c may have electrical conductances between the first conductive lines 40C and the upper electrode patterns 530C, and the dummy multilayered structure patterns 1d may have electrical conductances between the first intermediate dummy conductive lines 40D and the dummy upper electrode patterns 530D. The multilayered structure patterns 1c and the dummy multilayered structure patterns 1d may by electrically connected to the first interconnecting layers 20C in the cell region C and the first dummy interconnecting layers 20D in the dummy region D via the second plugs 30C and the second dummy plugs 30D, respectively.

Figure 7A:
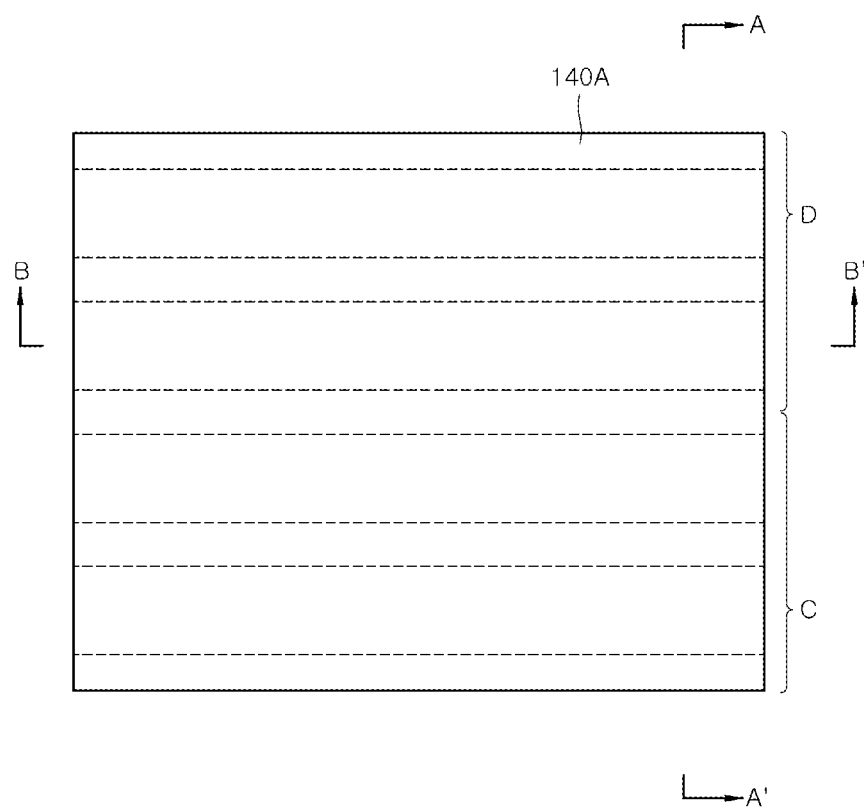
Figure 7B:
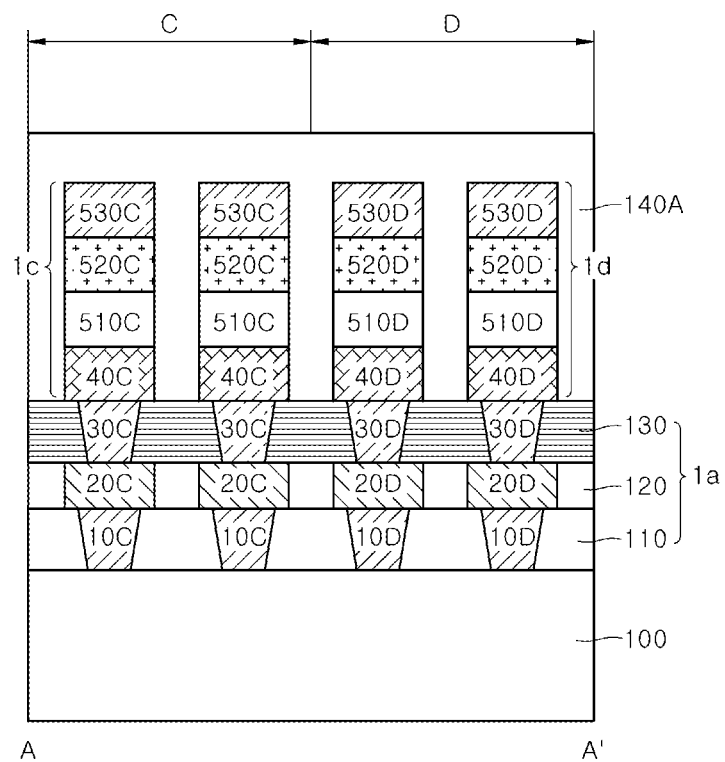
Figure 7C:
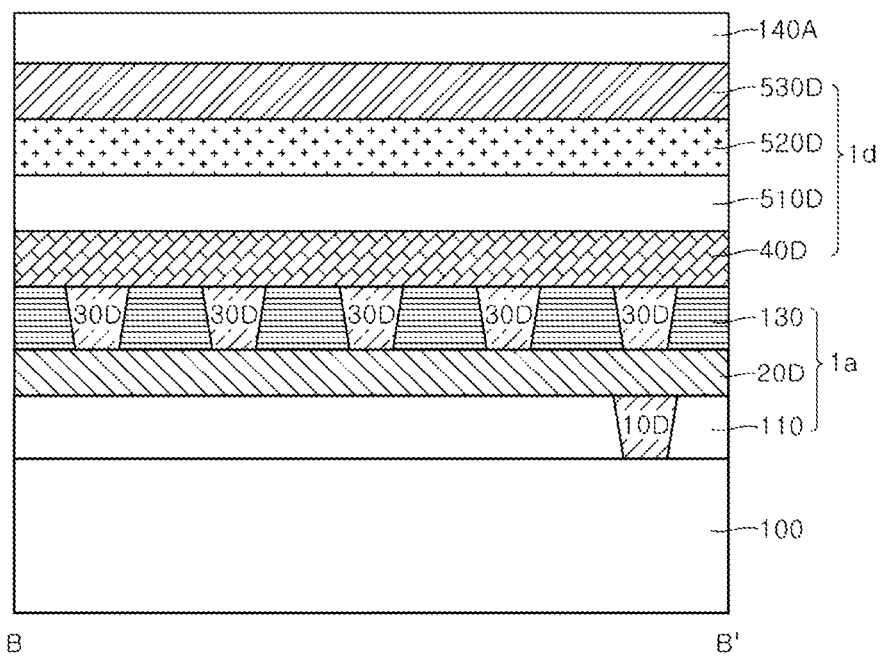

Referring to FIGS. 7A, 7B and 7C, an insulating material layer 140A covering side and upper surfaces of the multilayered structure patterns 1c and the dummy multilayered structure patterns 1d may be formed over the lower interconnection structure 1a. The multilayered structure patterns 1s and 1d may be insulated from each other by the insulating material layer 140A. The insulating material layer 140A may include oxide, nitride, or oxynitride, as non-limiting examples. The insulating material layer 140A may be formed by using a chemical vapor deposition method, a coating method, or the like, as non-limiting examples.

Figure 8A:
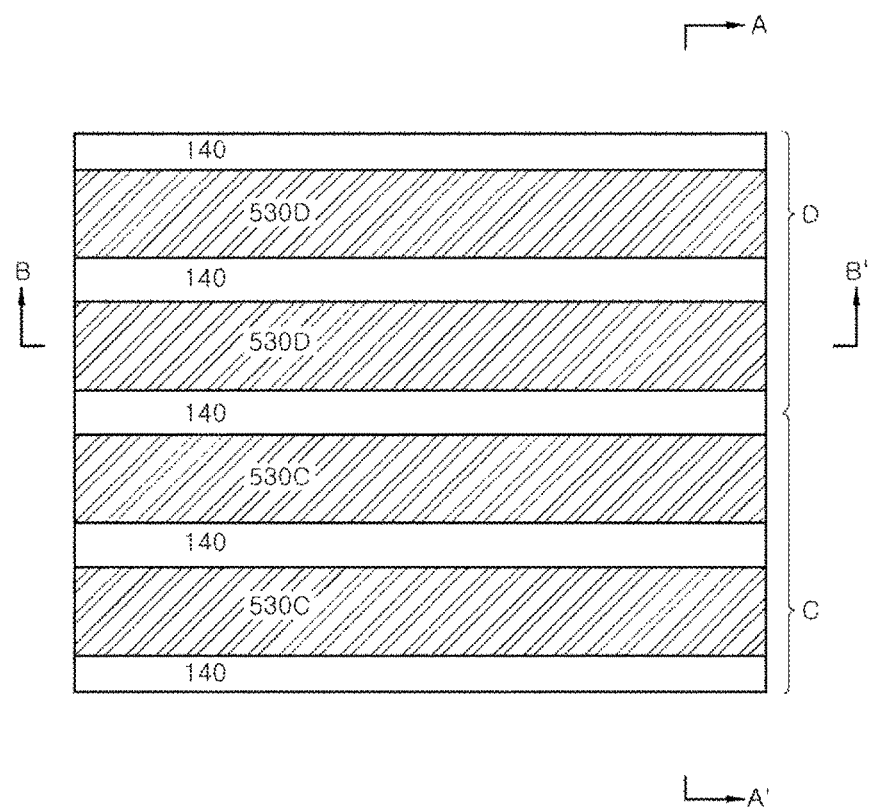
Figure 8B:
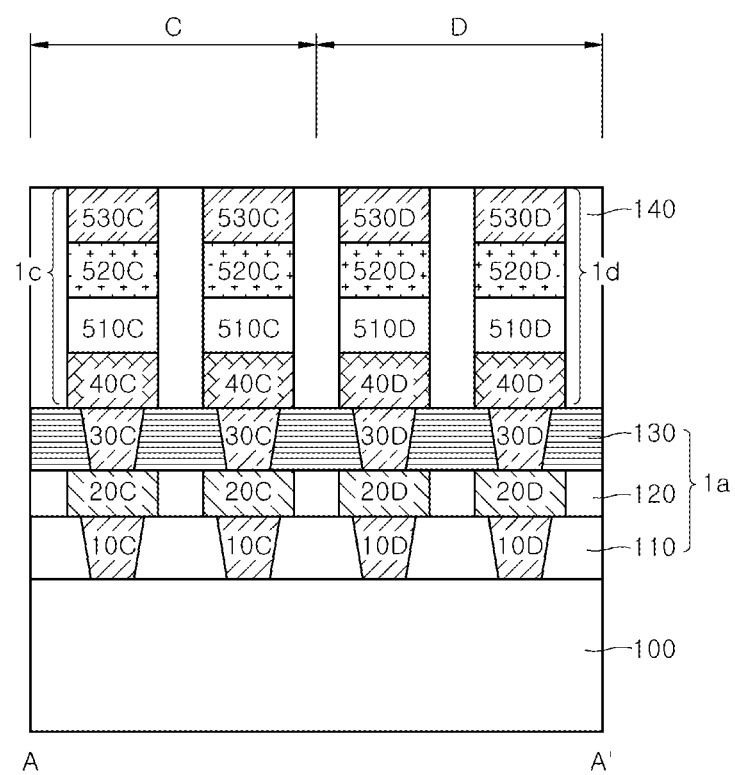
Figure 8C:
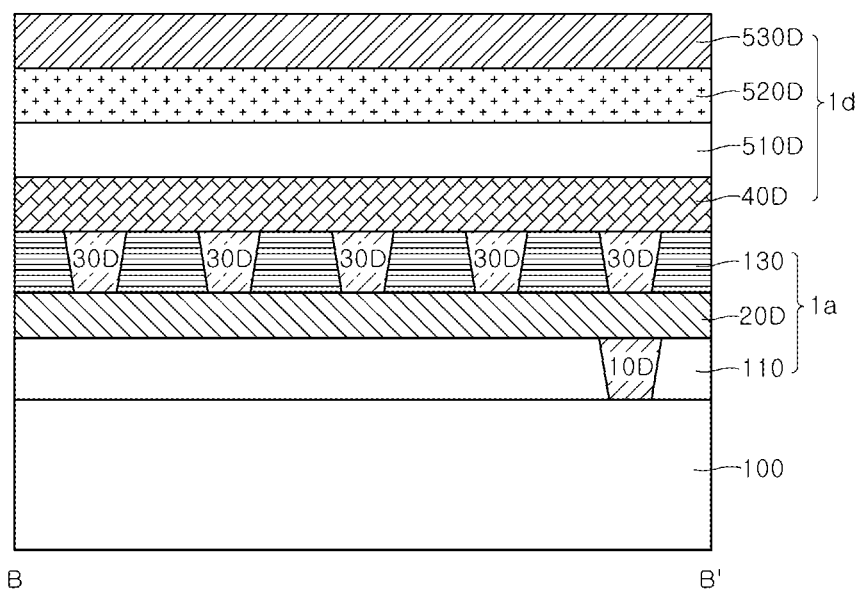

Referring to FIGS. 8A, 8B, and 8C, the insulating material layer 140A may be planarized using a chemical mechanical polishing process to form an interlayer insulating layer 140 exposing the upper electrode patterns 530C of the multilayered structure patterns 1c and the dummy upper electrode patterns 530D of the dummy multilayered structure patterns 1d. As a result of the chemical mechanical polishing process, an upper surface of the interlayer insulating layer 140, upper surfaces of the upper electrode patterns 530C, and upper surfaces of the dummy upper electrode patterns 530D may be located on substantially the same plane. In other words, the upper surface of the interlayer insulating layer 140 are substantially coplanar with the upper surfaces of the upper electrode patterns 530C and the upper surfaces of the dummy upper electrode patterns 530D.

In the chemical mechanical polishing process using polishing slurry, since the lower interconnection structures 1a are formed both in the cell region C and in the dummy region D, even if the upper surfaces of the upper electrode patterns 530C and the upper surfaces of the dummy upper electrode patterns 530D are exposed to the polishing slurry, a deviation of corrosion reactions between the cell region C and dummy region D may not occur. Specifically, a rate of a first corrosion reaction between the polishing slurry and the exposed upper surfaces of the upper electrode patterns 530C may be substantially the same as a rate of a second corrosion reaction between the polishing slurry and the exposed upper surfaces of the dummy upper electrode patterns 530D. Therefore, the multilayered structure patterns 1c may have the substantially same height as the dummy multilayered structure patterns 1d, after the chemical mechanical polishing process is performed. In some embodiments, recesses of the multilayered structure patterns 1c and the dummy multilayered structure patterns 1d caused by the corrosion reactions may be decreased by increasing an area of the dummy region D including corresponding lower interconnection structures 1a. For example, an amount of a removed portion in each of the multilayered structure patterns 1c and the dummy multilayered structure patterns 1d due to a corrosion reaction when the dummy region D has a first area may be decreased compared to that when the dummy region D has a second area, where the first area is greater than the second area.

Figure 9A:
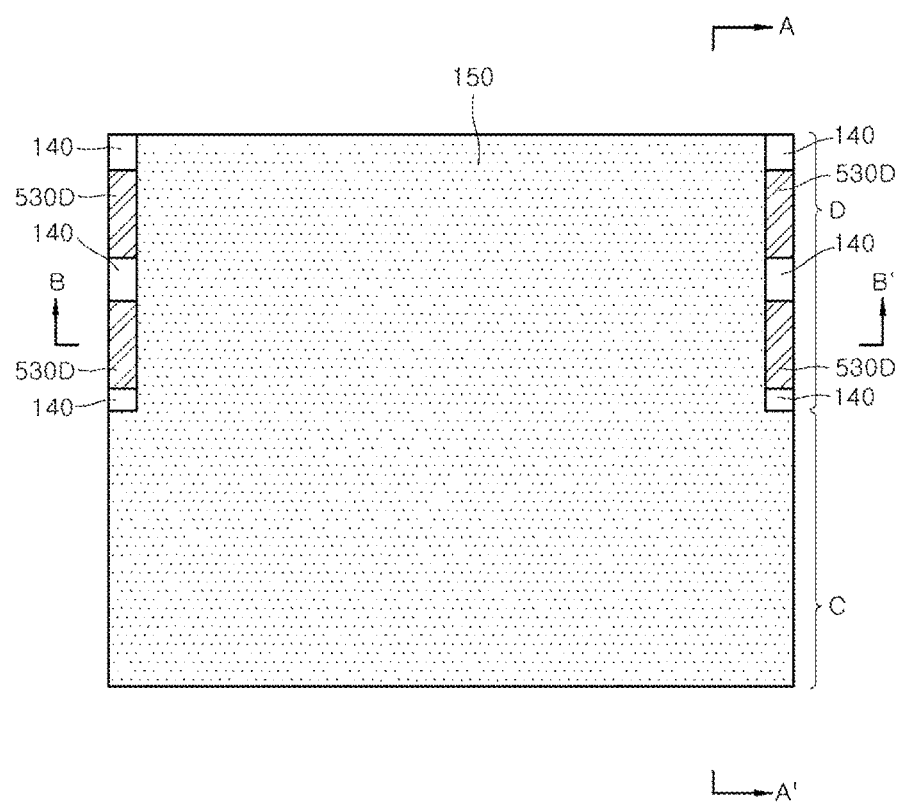
Figure 9B:
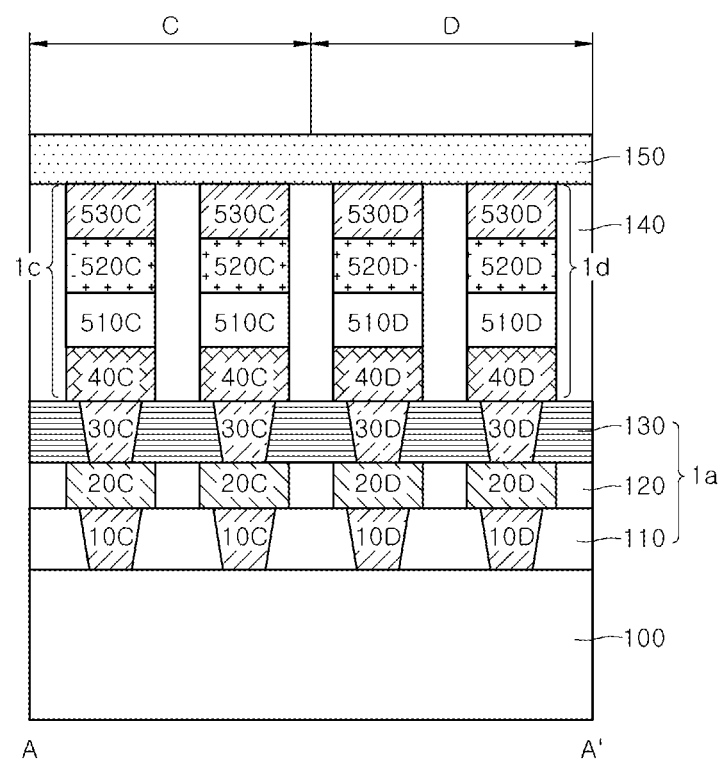
Figure 9C:
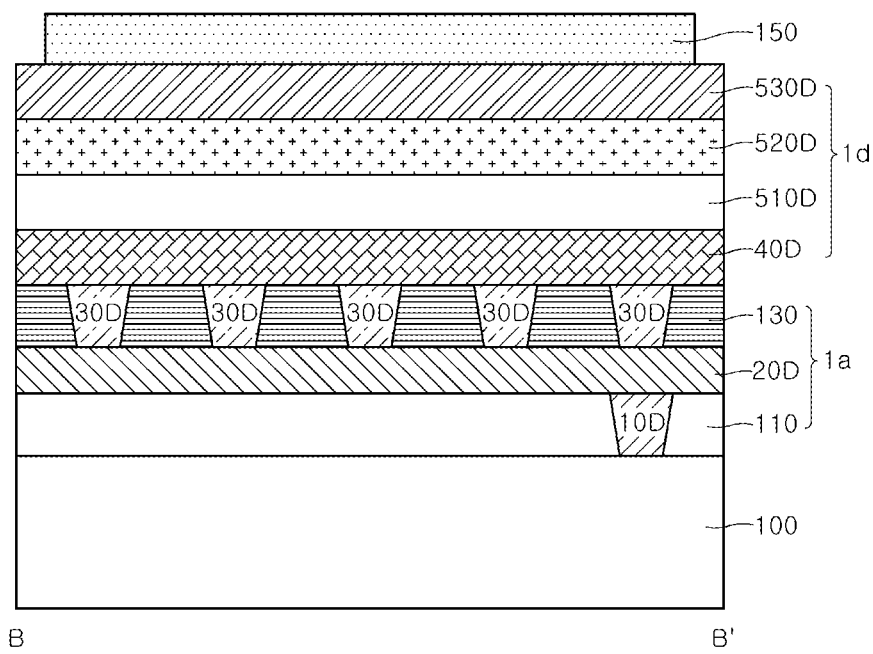

Referring to FIGS. 9A, 9B, and 9C, a dummy open mask pattern 150 exposing at least a portion of the upper surfaces of the dummy upper electrode patterns 530D and at least a portion of the upper surface of the interlayer insulating layer 140 in the dummy region D may be formed over the multilayered structure patterns 1c and the dummy multilayered structure patterns 1d and the interlayer insulating layer 140. As illustrated, the portions exposed by the dummy open mask pattern 150 may be located in outer portions of the dummy region D.

Figure 10A:
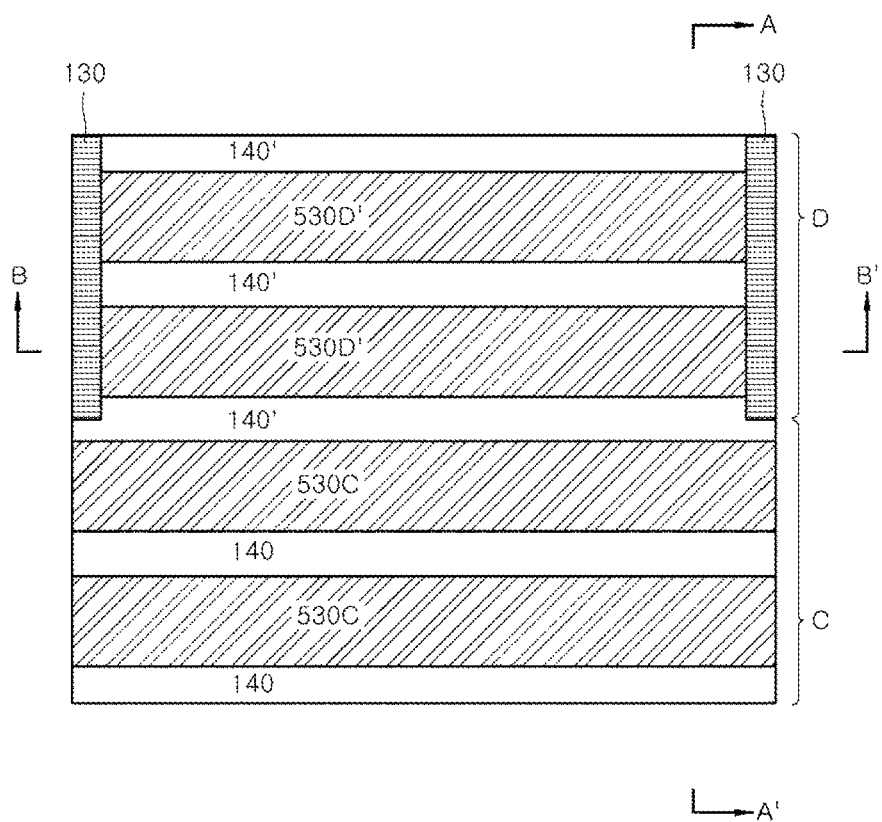
Figure 10B:
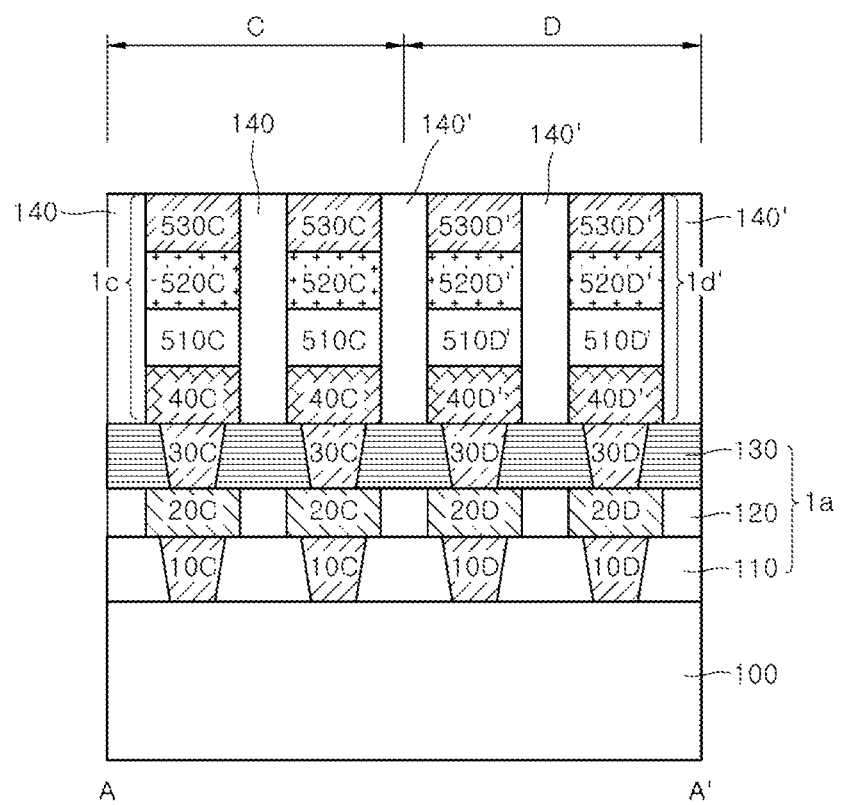
Figure 10C:
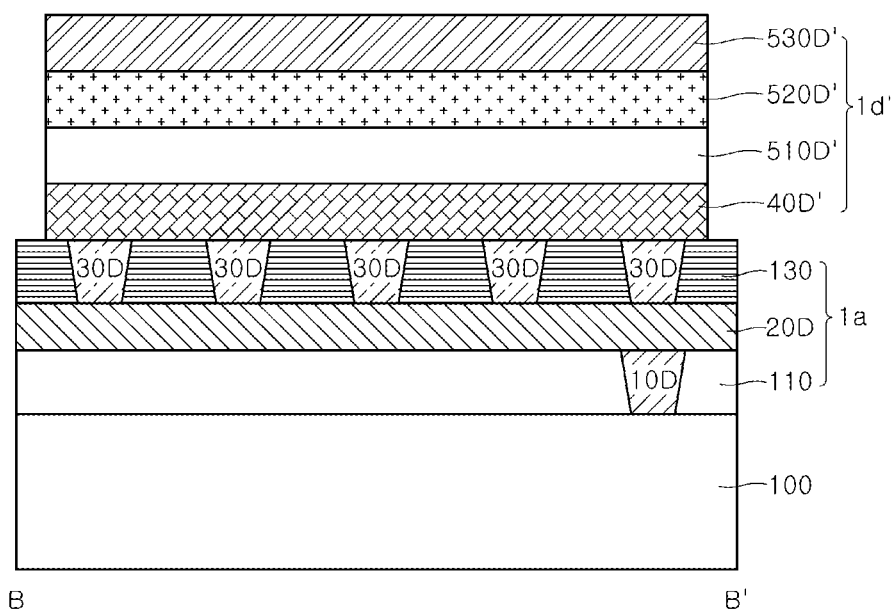

Referring to FIGS. 10A, 10B, and 10C, the dummy multilayered structure pattern 1d and the interlayer insulating layer 140 may be etched until portions of an upper surface of the third interlayer insulating layer 130 are exposed. The dummy multilayered structure pattern 1d and the interlayer insulating layer 140 may be etched by using an anisotropic etching process such as a dry etching process, as a non-limiting example. Alternatively, the multilayered structure pattern 1d and the interlayer insulating layer 140 may be etched by using an isotropic etching process such as a wet etching process, as a non-limiting example.

As a result of the etching process, each of the etched dummy multilayered structure patterns 1d' in the dummy region D may include a first dummy conductive line 40D', an etched dummy lower electrode pattern 510D', an etched dummy memory film pattern 520D', and an etched dummy upper electrode pattern 530D'. An etched interlayer insulating layer 140' may be formed in the dummy region D.

Figure 11A:
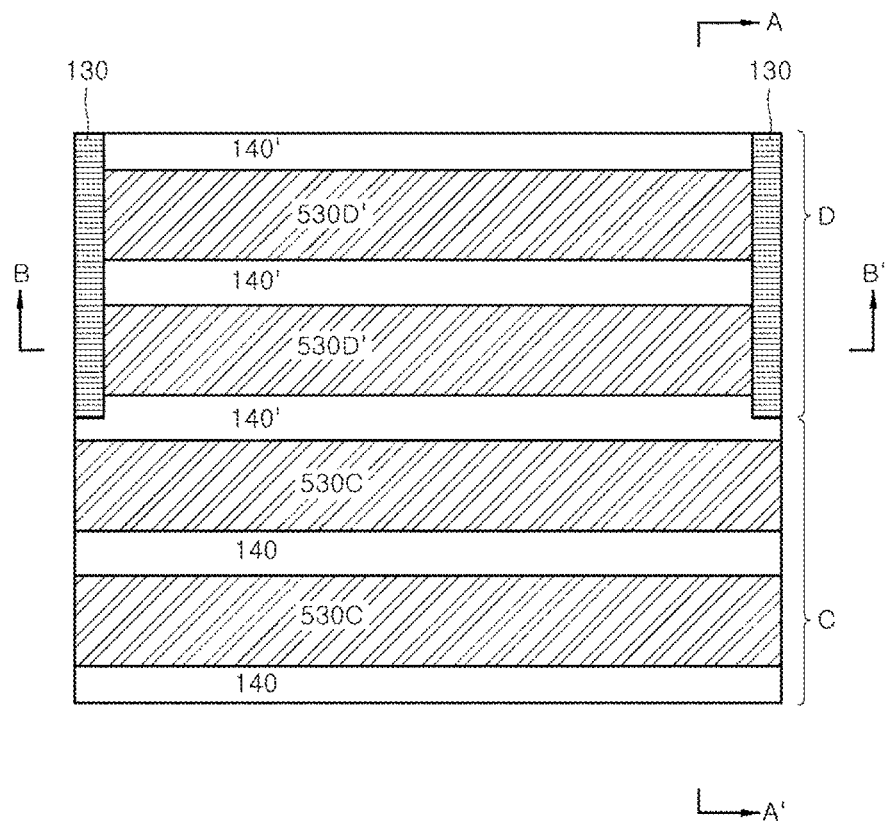
Figure 11B:
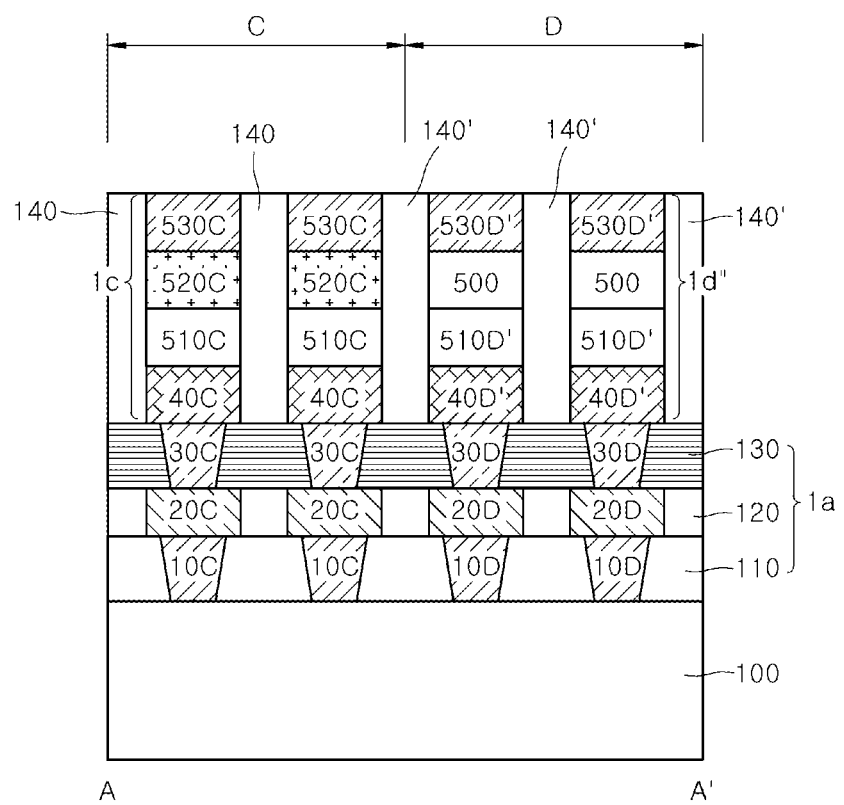
Figure 11C:
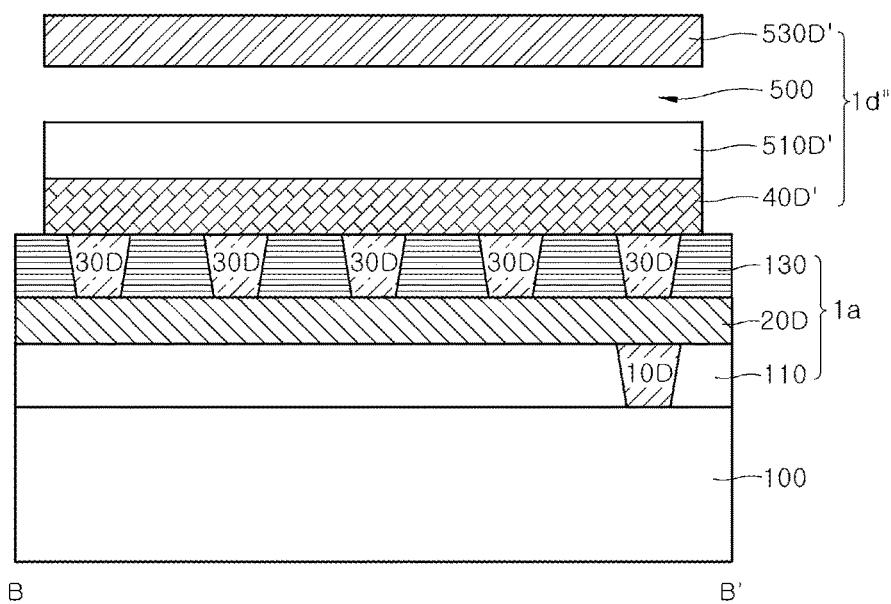

Referring to FIGS. 11A, 11B, and 11C, a wet etchant may be provided on side surfaces of the etched dummy multilayered structure pattern 1d' to remove the etched dummy memory film pattern 520D' along a specific direction (e.g., a direction substantially parallel to the top surface of the substrate 100). The wet etchant may include a material having an etch selectivity between the etched dummy memory film pattern 520D' and other layers including the third interlayer insulating layer 130, the first dummy conductive line 40D', the etched dummy lower electrode pattern 510D', and the etched dummy upper electrode pattern 530D'.

As a result of the etching process, voids 500 may be formed in an intermediate dummy multilayered structure pattern 1d''' along the specific direction. The voids 500 may block corresponding electrical conduction paths in a direction perpendicular to the specific direction (e.g., the direction perpendicular to the top surface of the substrate 100) of the intermediate multilayered structure pattern 1d''' in the dummy region D.

Figure 12A:
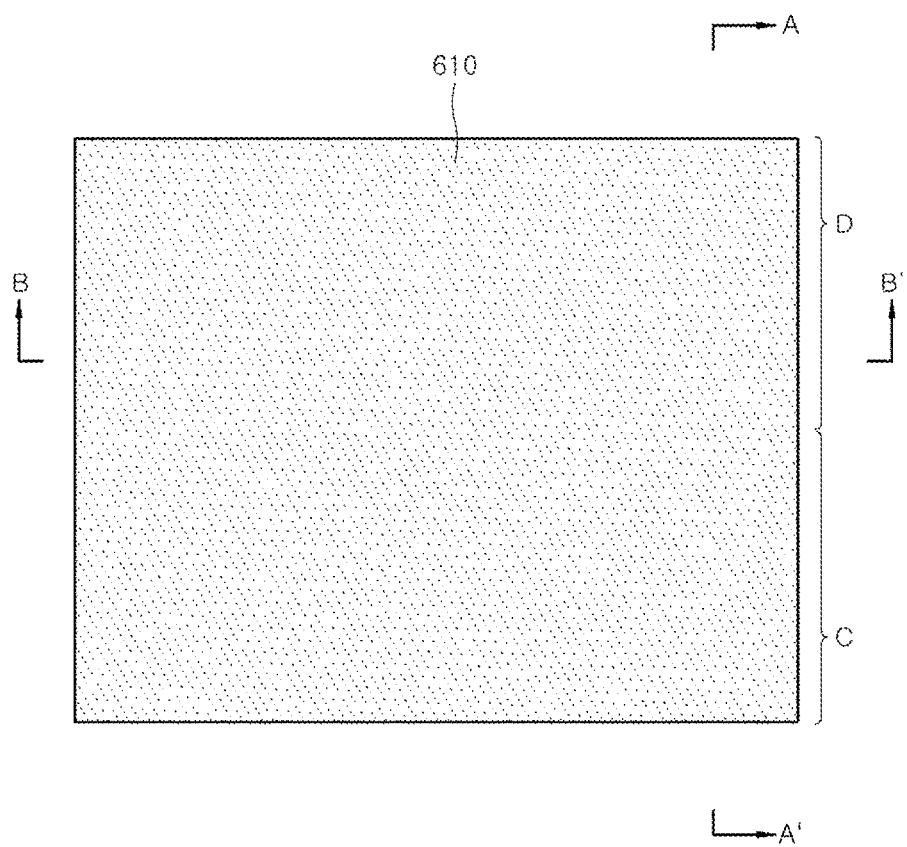
Figure 12B:
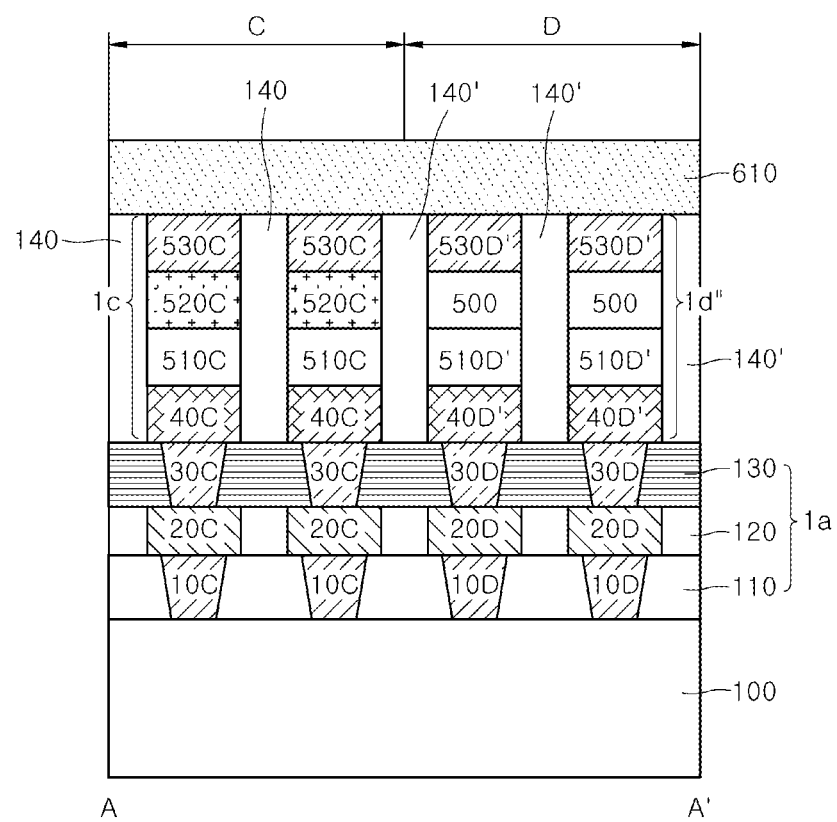
Figure 12C:
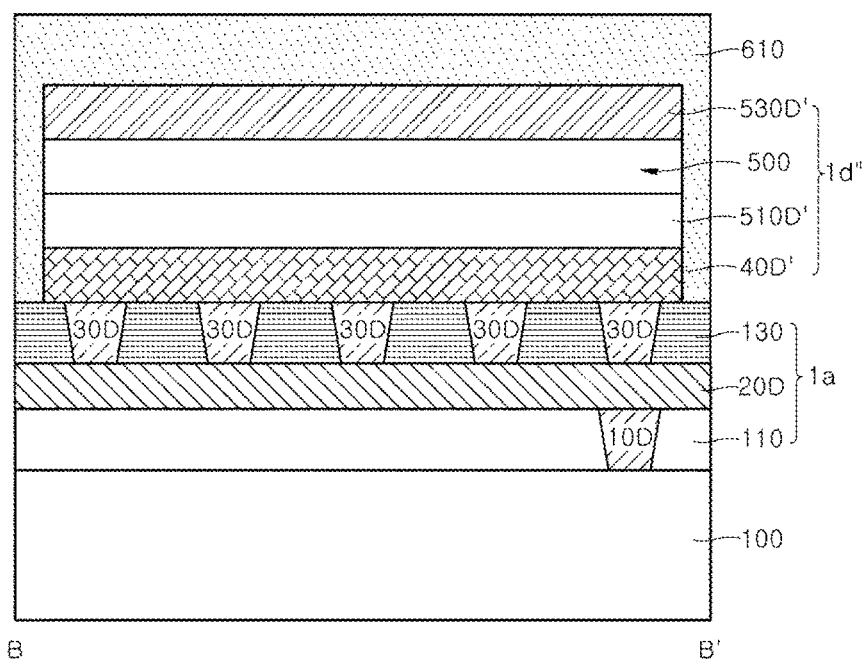

Referring to FIGS. 12A, 12B, and 12C, a second conductive layer 610 may be formed on the upper electrode patterns 530C and the etched dummy upper electrode patterns 530D', and on the interlayer insulating layer 140 and the etched interlayer insulating layer 140'. The second conductive layer 610 may fill spaces except the voids 500 in the intermediate multilayered structure patterns 1d''' in the dummy region D.

The second conductive layer 610 may include a metal or a conductive metal nitride, as non-limiting examples. In an embodiment, the metal may include aluminum (Al), titanium (Ti), tungsten (W), or the like. As an example, the metal nitride may include titanium nitride (TiN), tungsten nitride (WN), or the like.

Figure 13A:
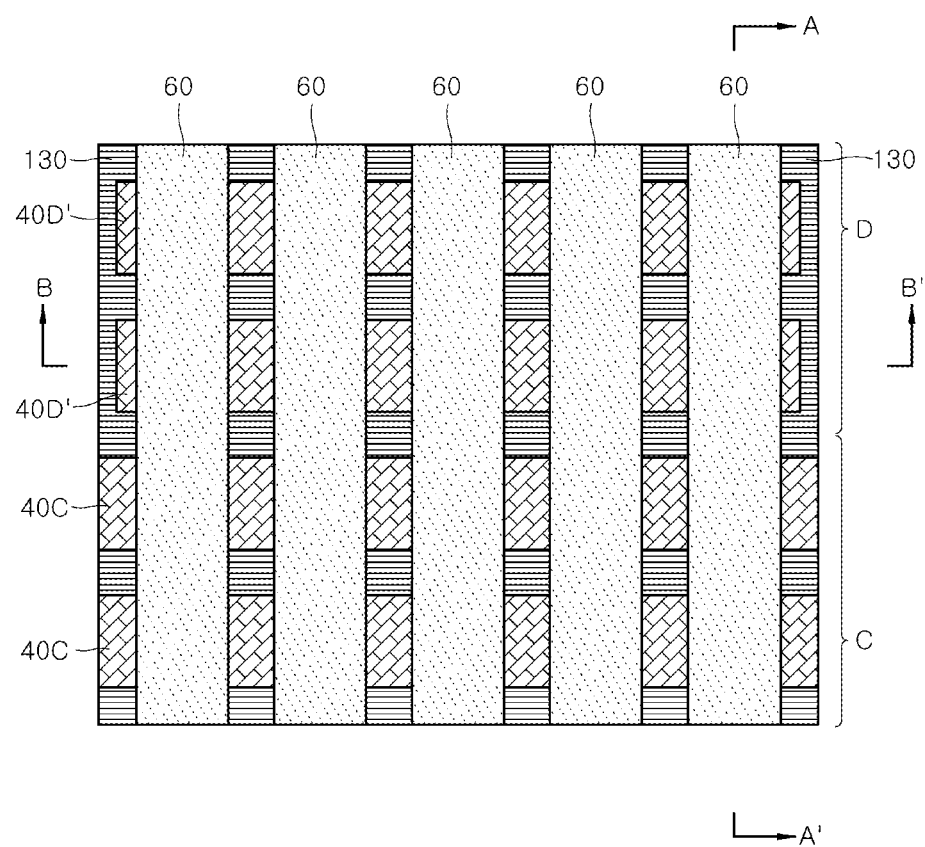
Figure 13B:
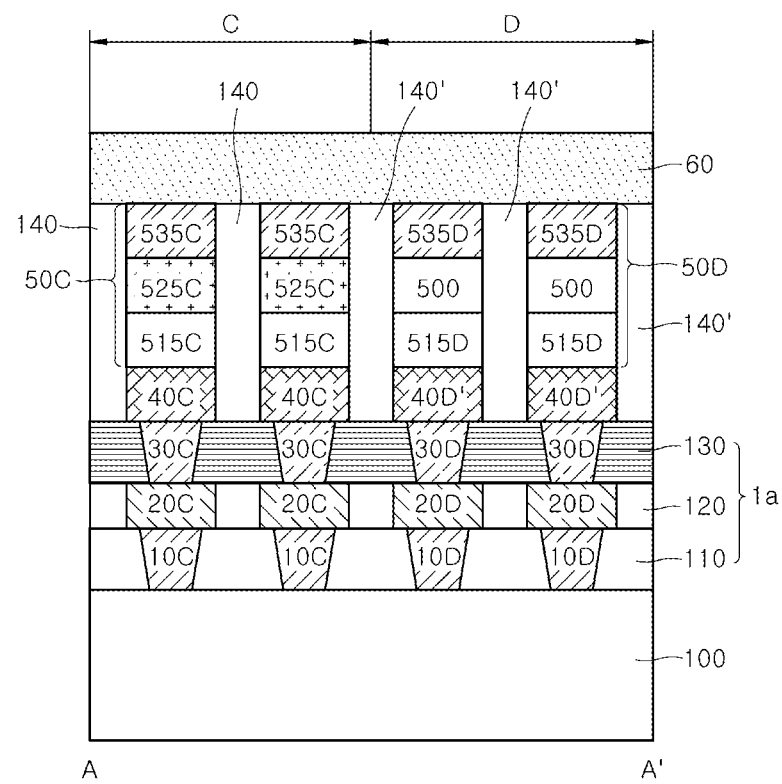
Figure 13C:
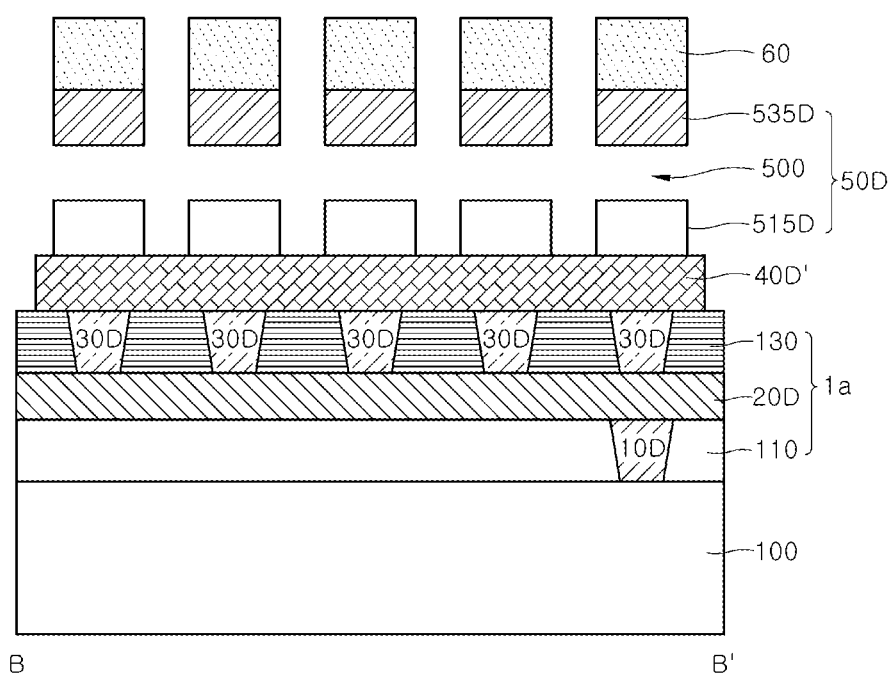

Referring to FIGS. 13A, 13B, and 13C, an etch mask pattern (not illustrated) may be formed on the second conductive layer 610 in a third direction not parallel to the first direction in which the first conductive lines 40C and the first dummy conductive lines 40D' extend. In an embodiment, the third direction is perpendicular to the first direction. Then, the second conductive layer 610, the upper electrode patterns 530C, the etched dummy upper electrode patterns 530D', the memory film patterns 520C, the lower electrode patterns 510C, and the etched dummy lower electrode patterns 510D' may be selectively etched using the etch mask pattern to form a plurality of pillar-shaped structures 50C, a plurality of dummy pillar-shaped structures 50D, and second conductive lines 60 over the first conductive lines 40C and the first dummy conductive lines 40D'.

Each of the cell pillar-shaped structures 50C located in the cell region C may include a lower electrode layer 515C, a resistive memory layer 525C, and an upper electrode layer 535C, and each of the dummy pillar-shaped structures 50D located in the dummy region D may include a dummy lower electrode layer 515D, the void 500, and a dummy upper electrode layer 535D. The void 500 can block the electrical conduction path of the dummy pillar-shaped structure 50D in a specific direction (e.g., the vertical direction perpendicular to the top surface of the substrate 100). As an example, even if a voltage is applied between the first dummy conductive line 40D' and the second conductive line 60, or between the substrate 100 and the second conductive line 60, the electrical conduction in the vertical direction via the dummy pillar-shaped structure 50D in the dummy region D can be suppressed.

In some other embodiments, when the wet etching process described above with reference to FIGS. 11A, 11B, and 11C is performed, voids (not shown) can be formed by removing one or both of the etched lower electrode pattern 510D' and the etched upper electrode pattern 530D' shown in FIGS. 10A, 10S, and 10C, in place of the etched memory film pattern 520D'. Alternatively, in some other embodiments, when the wet etching process described above with reference to FIGS. 11A, 11B and 11C is performed, voids (not shown) can be formed by removing the etched lower electrode pattern 510D', the etched memory film pattern 520D' and the etched upper electrode pattern 530D' shown in FIGS. 10A, 10B, and 10C.

Using the above-described manufacturing methods according to various embodiments of the present disclosure, semiconductor devices can be manufactured. According to embodiments of the present disclosure, a plurality of lower interconnection structures can be formed in a cell region and a dummy region of a substrate.

Subsequently, multilayered structure patterns and dummy multilayered structure patterns may be stacked on the lower interconnection structures, and an insulating material layer covering the multilayered structure patterns may be formed. Then, the insulating material layer may be chemically and mechanically polished using polishing slurry to planarize the insulating material layer in the cell region and the dummy region.

According to an embodiment of the present disclosure, one or more lower interconnection structures can be disposed in the dummy region of the substrate. Accordingly, when conductive layers (e.g., the upper electrode patterns 530C and the dummy upper electrode patterns 530D) in the multilayered structure patterns and the dummy multilayered structure patterns are exposed during the chemical mechanical polishing of the insulating material layer, a deviation of corrosion reactions between the cell region and the dummy region can be suppressed. As a result, after the chemical mechanical polishing is performed, the structural reliability of the multilayered structure patterns disposed in the cell region and the dummy multilayered structure patterns disposed in the dummy region can be secured.

In addition, a wet etching process is performed as a subsequent process to further remove at least one film pattern (e.g., the etched dummy memory film pattern 520D') of the etched dummy multilayered structure pattern in the dummy region. As a result, it is possible to substantially prevent unnecessary electrical conduction in the dummy pillar-shaped structure in the dummy region in a specific direction (e.g., the vertical direction perpendicular to the top surface of the substrate 100).

The above-described embodiments of the inventive concept have been disclosed for illustrative purposes. Those of ordinary skill in the art will appreciate that various modifications, additions and substitutions are possible, without departing from the scope and spirit of the inventive concept as disclosed in the accompanying claims.

What is claimed is:

1. A method of manufacturing a semiconductor device, the method comprising:
    providing a substrate that includes a cell region and a dummy region;
    forming lower interconnection structures in the cell region and the dummy region;
    forming one or more first multilayered structure patterns in the cell region and one or more second multilayered structure patterns in the dummy region over the lower interconnection structures, the first multilayered structure patterns and the second multilayered structure patterns extending in a first direction, each of the second multilayered structure patterns including an etch target layer, the first direction being parallel to a top surface of the substrate;
    forming an insulating material layer over the first multilayered structure patterns and the second multilayered structure patterns;
    forming an interlayer insulating layer that fills a space between two adjacent patterns of the first multilayered structure patterns and second multilayered structure patterns by chemically and mechanically polishing the insulating material layer; and
    removing the etch target layer in each of the second multilayered structure patterns.

2. The method of claim 1, wherein each of the first multilayered structure patterns and second multilayered structure patterns is electrically connected to at least one interconnecting layer of the lower interconnection structures.

3. The method of claim 1, wherein the etch target layer comprises a conducting material or a variable resistance material, the variable resistance material having electrical resistance that switches between a low resistance state and a high resistance state.

4. The method of claim 1, wherein each of the first multilayered structure patterns and second multilayered structure patterns has an electrical conduction path in a second direction perpendicular to the top surface of the substrate.

5. The method of claim 4, wherein removing the etch target layer comprises forming a void in each of the second multilayered structure patterns and removing the electrical conduction path in the second direction in the second multilayered structure patterns.

6. The method of claim 1, wherein each of the first multilayered structure patterns includes an upper electrode pattern, and each of the second multilayered structure patterns further includes a dummy upper electrode pattern, and
wherein chemically and mechanically polishing the insulating material layer is performed until upper surfaces of the upper electrode patterns and upper surfaces of the dummy upper electrode patterns are exposed.

7. The method of claim 1, wherein chemically and mechanically polishing the insulating material layer comprises polishing the insulating material layer until an upper surface of the interlayer insulating layer, upper surfaces of the first multilayered structure patterns, and upper surfaces of the second multilayered structure patterns are coplanar.

8. The method of claim 1, wherein removing the etch target layer comprises:
forming an open mask pattern that exposes at least a portion of the second multilayered structure patterns and at least a portion of the interlayer insulating layer;
forming etched second multilayered structure patterns by etching the second multilayered structure patterns to expose side surfaces of the etched second multilayered structure patterns, each of the etched second multilayered structure patterns including an etched etch target layer; and
removing the etched etch target layers in the etched second multilayered structure patterns along the first direction by providing an etchant on the exposed side surfaces of the etched second multilayered structure patterns.

9. The method of claim 1, wherein removing the etch target layer in each of the second multilayered structure patterns comprises forming voids in the second multilayered structure patterns, the voids disposed along the first direction.

10. A method of manufacturing a semiconductor device, the method comprising:
providing a substrate that includes a cell region and a dummy region;
forming lower interconnection structures over the substrate, each of the lower interconnection structures including a first interconnecting layer disposed in the cell region and a second interconnecting layer disposed in the dummy region;
forming first multilayered structure patterns in the cell region and second multilayered structure patterns in the dummy region over the lower interconnection structures, each of the first multilayered structure patterns and each of the second multilayered structure patterns extending in a first direction and having an electrical conduction path in a second direction, the first direction being parallel to a top surface of the substrate, the second direction being perpendicular to the top surface of the substrate;
forming an insulating material layer over the first multilayered structure patterns and the second multilayered structure patterns;
chemically and mechanically polishing the insulating material layer to form an interlayer insulating layer that fills a space between two adjacent patterns of the first multilayered structure patterns and second multilayered structure patterns; and
removing at least one layer of each of the second multilayered structure patterns to selectively block the electrical conduction path of each of the second multilayered structure patterns in the second direction.

11. The method of claim 10, wherein each of the first multilayered structure patterns is electrically connected to the first interconnecting layer, and each of the second multilayered structure patterns is electrically connected to the second interconnecting layer.

12. The method of claim 10, wherein forming the first multilayered structure patterns in the cell region and the second multilayered structure patterns in the dummy region comprises:
forming a stacked structure that includes a first conductive layer, a lower electrode layer, a resistive memory film, and an upper electrode layer; and
selectively etching the stacked structure to form the first multilayered structure patterns and the second multilayered structure patterns,
wherein each of the first multilayered structure patterns comprises a first conductive line, a lower electrode pattern, a memory film pattern, and an upper electrode pattern, and each of the second multilayered structure patterns includes a first intermediate dummy conductive line, a dummy lower electrode pattern, a dummy memory film pattern, and a dummy upper electrode pattern.

13. The method of claim 12, wherein chemically and mechanically polishing the insulating material layer comprises exposing the upper electrode patterns of the first multilayered structure patterns and the dummy upper electrode patterns of the second multilayered structure patterns.

14. The method of claim 12, wherein blocking the electrical conduction path in the second direction of each of the second multilayered structure patterns comprises:
forming a dummy open mask pattern that exposes at least a portion of the second multilayered structure patterns and at least a portion of the interlayer insulating layer;
forming etched second multilayered structure patterns by etching the second multilayered structure patterns to expose side surfaces of the etched second multilayered structure patterns, each of the etched second multilayered structure patterns including an etched dummy lower electrode pattern, an etched dummy memory film pattern, and an etched dummy upper electrode pattern; and
removing one or more of the etched dummy lower electrode patterns, the etched dummy memory film patterns, and the etched dummy upper electrode patterns along the first direction by providing a wet etchant on the exposed side surfaces of the etched second multilayered structure patterns.

15. The method of claim 14, wherein blocking the electrical conduction path in the second direction of each of the second multilayered structure patterns further comprises forming voids in the etched second multilayered structure patterns, the voids arranged along the first direction.

16. The method of claim 14, wherein, after chemically and mechanically polishing the insulating material layer is performed, the method further comprises:

forming a second conductive layer on the upper electrode patterns and the etched dummy upper electrode patterns;

forming etching mask patterns each extending in a third direction intersecting with the first direction, the third direction being parallel to the top surface of the substrate; and selectively etching the second conductive layer to form a plurality of second conductive lines, selectively etching the upper electrode patterns, the memory film patterns, the lower electrode patterns to form a plurality of first pillar-shaped structures, and selectively etching the etched dummy upper electrode patterns, the etched dummy memory film patterns, the etched dummy lower electrode patterns to form a plurality of second pillar-shaped structures, wherein each of the first pillar-shaped structures includes a lower electrode layer, a resistive memory layer, and an upper electrode layer, and each of the second pillar-shaped structures includes a dummy lower electrode layer, a void, and a dummy upper electrode layer.

* * * * *